(12) United States Patent
Chen et al.

(10) Patent No.: US 11,067,884 B2
(45) Date of Patent: Jul. 20, 2021

(54) THROUGH-DISPLAY OPTICAL TRANSMISSION, RECEPTION, OR SENSING THROUGH MICRO-OPTIC ELEMENTS

(71) Applicant: Apple Inc., Cupertino, CA (US)

(72) Inventors: Tong Chen, Cupertino, CA (US); Mark T. Winkler, San Jose, CA (US); Meng-Huan Ho, San Jose, CA (US); Rui Liu, San Jose, CA (US); Xiao Xiang, San Jose, CA (US); Wenrui Cai, San Jose, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 16/723,850

(22) Filed: Dec. 20, 2019

(65) Prior Publication Data

US 2020/0209729 A1    Jul. 2, 2020

Related U.S. Application Data

(60) Provisional application No. 62/785,152, filed on Dec. 26, 2018.

(51) Int. Cl.
*G03B 21/62* (2014.01)
*H01L 51/50* (2006.01)
(Continued)

(52) U.S. Cl.
CPC .............. *G03B 21/62* (2013.01); *G02B 5/128* (2013.01); *G03B 21/10* (2013.01); *G03B 21/56* (2013.01);
(Continued)

(58) Field of Classification Search
CPC ...... G03B 21/625; G03B 21/10; G03B 21/56; H04N 9/3141
(Continued)

(56) References Cited

U.S. PATENT DOCUMENTS 6,586,776 B1 * 7/2003 Liu ..................... H01S 5/0262
                                                    257/82
6,919,681 B2 * 7/2005 Cok ..................... G09G 3/3216
                                                    313/500
(Continued)

FOREIGN PATENT DOCUMENTS

CN        105531653        4/2016
CN        107180853        9/2017
(Continued)

OTHER PUBLICATIONS

U.S. Appl. No. 16/376,987, filed Apr. 5, 2019, Yeke Yazdandoost, et al.
(Continued)

*Primary Examiner* — Clayton E. LaBalle
*Assistant Examiner* — Kevin C Butler
(74) *Attorney, Agent, or Firm* — Brownstein Hyatt Farber Schreck, LLP

(57) ABSTRACT

A device includes a display stack and an optical receiver. The display stack includes a set of opaque elements defining a translucent aperture. The translucent aperture extends through the display stack. The optical receiver is spaced apart from and behind a back surface of the display stack. At least one micro-optic element is formed on the back surface of the display stack, between the display stack and the optical receiver. The at least one micro-optic element includes a micro-optic element having a focal point located within the translucent aperture. The optical receiver is configured to receive light through the translucent aperture and the at least one micro-optic element.

25 Claims, 21 Drawing Sheets

(51) Int. Cl.
*G06F 3/044* (2006.01)
*G02B 5/128* (2006.01)
*G03B 21/10* (2006.01)
*G03B 21/625* (2014.01)
*G03B 21/56* (2006.01)
*H04N 9/31* (2006.01)
*H04B 10/40* (2013.01)

(52) U.S. Cl.
CPC ........... *G03B 21/625* (2013.01); *G06F 3/044* (2013.01); *H01L 51/50* (2013.01); *H04N 9/3141* (2013.01); *H04B 10/40* (2013.01)

(58) Field of Classification Search
USPC ........................................................ 359/460
See application file for complete search history.

(56) References Cited

U.S. PATENT DOCUMENTS

| | | | | |
|---|---|---|---|---|
| 6,946,647 | B1* | 9/2005 | O'Neill | G01J 3/02 250/227.2 |
| 6,948,820 | B2* | 9/2005 | Veligdan | G02B 6/08 348/804 |
| 7,499,094 | B2* | 3/2009 | Kuriyama | H01L 27/14645 348/340 |
| 7,706,073 | B2* | 4/2010 | Munro | B29D 11/00278 359/627 |
| RE41,673 | E* | 9/2010 | Ma | G09G 3/346 313/504 |
| 8,077,393 | B2* | 12/2011 | Steenblik | G02B 3/0056 359/619 |
| 8,305,400 | B2* | 11/2012 | Otani | G02F 1/1362 345/690 |
| 8,664,655 | B2* | 3/2014 | Lee | H01L 27/3213 257/45 |
| 8,743,027 | B2* | 6/2014 | Wu | G09G 3/3225 345/76 |
| 8,780,065 | B2* | 7/2014 | Ribeiro | G06F 3/0446 345/173 |
| 9,007,349 | B2* | 4/2015 | Tseng | G06F 3/0308 345/183 |
| 9,112,043 | B2* | 8/2015 | Arai | H01L 29/7869 |
| 9,183,779 | B2* | 11/2015 | Soto | G09G 3/3233 |
| 9,342,181 | B2* | 5/2016 | Wyatt | G09G 5/18 |
| 9,530,381 | B1* | 12/2016 | Bozarth | G09G 3/3406 |
| 9,570,002 | B2 | 2/2017 | Sakariya et al. | |
| 9,614,168 | B2* | 4/2017 | Zhang | H01L 51/004 |
| 9,741,286 | B2* | 8/2017 | Sakariya | G09G 3/2092 |
| 9,870,075 | B2 | 1/2018 | Han et al. | |
| 9,909,862 | B2 | 3/2018 | Ansari et al. | |
| 10,079,001 | B2* | 9/2018 | Hodges | G09G 3/02 |
| 10,115,000 | B2 | 10/2018 | Mackey et al. | |
| 10,222,475 | B2* | 3/2019 | Pacala | H01L 31/02327 |
| 10,331,939 | B2 | 6/2019 | He et al. | |
| 10,410,037 | B2 | 9/2019 | He et al. | |
| 10,474,286 | B2* | 11/2019 | Bae | G06F 3/0442 |
| 10,565,734 | B2* | 2/2020 | Bevensee | H04N 5/22541 |
| 10,664,680 | B2 | 5/2020 | Xu et al. | |
| 10,809,853 | B2 | 10/2020 | Klenkler et al. | |
| 10,838,556 | B2 | 11/2020 | Yeke Yazdandoost et al. | |
| 10,872,222 | B2 | 12/2020 | Gao et al. | |
| 2003/0011888 | A1* | 1/2003 | Cox | G02B 6/4249 359/626 |
| 2003/0148391 | A1* | 8/2003 | Salafsky | G01N 33/6845 435/7.2 |
| 2012/0113357 | A1* | 5/2012 | Cheng | G02F 1/133555 349/64 |
| 2015/0309385 | A1* | 10/2015 | Shu | G02B 3/0037 359/296 |
| 2015/0364107 | A1* | 12/2015 | Sakariya | G06F 3/042 345/174 |
| 2017/0270342 | A1* | 9/2017 | He | G06K 9/00087 |
| 2018/0032778 | A1* | 2/2018 | Lang | G06F 3/0412 |
| 2018/0323243 | A1 | 11/2018 | Wang | |
| 2019/0034686 | A1* | 1/2019 | Ling | G06K 9/00053 |
| 2019/0221624 | A1* | 7/2019 | Lin | G09G 3/3233 |
| 2020/0209729 | A1* | 7/2020 | Chen | H01L 51/50 |

FOREIGN PATENT DOCUMENTS

| | | |
|---|---|---|
| CN | 107271404 | 10/2017 |
| CN | 108292361 | 7/2018 |
| CN | 108885693 | 11/2018 |
| CN | 109983471 | 7/2019 |
| EP | 3404484 | 11/2018 |
| JP | H0642898 | 2/1994 |
| WO | WO 17/204777 | 11/2017 |
| WO | WO 18/093798 | 5/2018 |
| WO | WO 18/186580 | 10/2018 |
| WO | WO 18/210317 | 11/2018 |

OTHER PUBLICATIONS

International Search Report and Written Opinion dated May 4, 2020, PCT/US2019/068353, 9 pages.
U.S. Appl. No. 16/815,875, filed Mar. 11, 2020, Chen et al.
U.S. Appl. No. 16/905,664, filed Jun. 18, 2020, Chen et al.
U.S. Appl. No. 16/945,643, filed Jul. 31, 2020, Chuang et al.
U.S. Appl. No. 16/945,174, filed Jul. 31, 2020, Chen et al.
U.S. Appl. No. 16/791,905, filed Feb. 14, 2020, Xiang.
U.S. Appl. No. 17/003,636, filed Aug. 26, 2020, Yeh et al.
U.S. Appl. No. 17/003,732, filed Aug. 26, 2020, Chen et al.
U.S. Appl. No. 17/006,708, filed Aug. 28, 2020, Ran et al.
U.S. Appl. No. 17/028,775, filed Sep. 22, 2020, Yeke Yazdandoost et al.

* cited by examiner

THROUGH-DISPLAY OPTICAL TRANSMISSION, RECEPTION, OR SENSING THROUGH MICRO-OPTIC ELEMENTS

CROSS-REFERENCE TO RELATED APPLICATION

This application is a nonprovisional of and claims the benefit under 35 U.S.C. 119(e) of U.S. Provisional Patent Application No. 62/785,152, filed Dec. 26, 2018, the contents of which are incorporated herein by reference as if fully disclosed herein.

FIELD

The described embodiments relate generally to devices (e.g., smartphones, tablet computers, or other devices) having under-display optical transmitters, receivers, and/or sensors. More particularly, the described embodiments relate to through-display optical transmission or reception through micro-optic elements (e.g., a micro-lens array), and in some cases to through-display optical sensing through micro-optic elements.

BACKGROUND

In some cases, it may be desirable to determine whether an object or user is proximate to a device, to determine the distance between an object or user and a device, or to determine a velocity or acceleration of an object or user with respect to a device. It may also be desirable to capture a two-dimensional (2D) or three-dimensional (3D) image of an object or user that is proximate to a device. In some cases, the 2D or 3D image may be an image of a fingerprint, a face, or a scene in a field of view (FoV). In some cases, it may be useful to wirelessly transmit or receive information between devices. It may also be useful to acquire images or data pertaining to a device's environment. In all of these cases, the measurements, images, or other data may be sensed or acquired optically.

SUMMARY

Embodiments of the systems, devices, methods, and apparatus described in the present disclosure are directed to under-display optical transmission, reception, and/or sensing. In accordance with described techniques, an optical transmitter, optical receiver, optical transceiver, or multiple optical transmitters, receivers and/or transceivers may be positioned behind a device's display, and light may be transmitted or received through translucent apertures extending from a front surface to a back surface of a display stack of the device. In this manner, an optical transmitter, receiver, or sensor may transmit or receive "through" a display. The optical transmitter, receiver, or sensor may opportunistically transmit or receive light through available translucent apertures in the display stack, or the display stack may be configured to provide translucent apertures in a deterministic pattern. When an optical transmitter, receiver, or sensor is positioned under a device's display, a portion of the device's display surface does not have to be reserved for the optical transmitter, receiver, or sensor, and in some cases the size of the device's display may be increased.

In a first aspect, the present disclosure describes a device including a display stack and an optical receiver. The display stack may include a set of opaque elements defining a translucent aperture. The translucent aperture may extend through the display stack. An optical receiver may be spaced apart from and behind a back surface of the display stack. At least one micro-optic element may be formed on or abutted to the back surface of the display stack, between the display stack and the optical receiver. The at least one micro-optic element may include a micro-optic element having a focal point located within the translucent aperture. The optical receiver may be configured to receive light through the translucent aperture and the at least one micro-optic element.

In another aspect, the present disclosure describes a device including a multi-layer display stack and an optical module. The multi-layer display stack may include a set of opaque elements. The set of opaque elements may include a set of light-emitting elements, a set of drive circuits coupled to the set of light-emitting elements, and a multi-layer mesh of conductive traces. The multi-layer mesh of conductive traces may be configured to route electrical signals to the set of drive circuits. Different subsets of the opaque elements may define different translucent apertures extending from a front surface to a back surface of the display stack. The optical module may be spaced apart from and behind the back surface of the display stack. At least one micro-optic element may be formed on the back surface of the display stack, between the display stack and the optical module. The at least one micro-optic element may include a micro-optic element having a focal point located within one of the translucent apertures. The optical module may include an optical transmitter, an optical receiver, or an optical transceiver. When the optical module includes a transmitter (or a transceiver having a transmitting component), the transmitter may be configured to transmit light through the translucent aperture(s) with minimal transmission loss using the at least one micro-optic element.

In still another aspect of the disclosure, a method of sensing a proximity of an object to a device having a light-emitting display is described. The method may include receiving light through a translucent aperture in a display surface of the light-emitting display; collimating the received light; condensing the collimated received light toward an optical receiver; quantifying an output of the optical receiver; and correlating the quantified output of the optical receiver to the proximity of the object to the device. In some embodiments, the translucent aperture may be a first translucent aperture, and the method may also include emitting light from an optical transmitter; collimating the emitted light; and focusing the collimated emitted light toward a second translucent aperture in the display surface. In some embodiments, the emitted light may be focused and/or re-imaged to shape the light in a far-field.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which.

Figure 12:
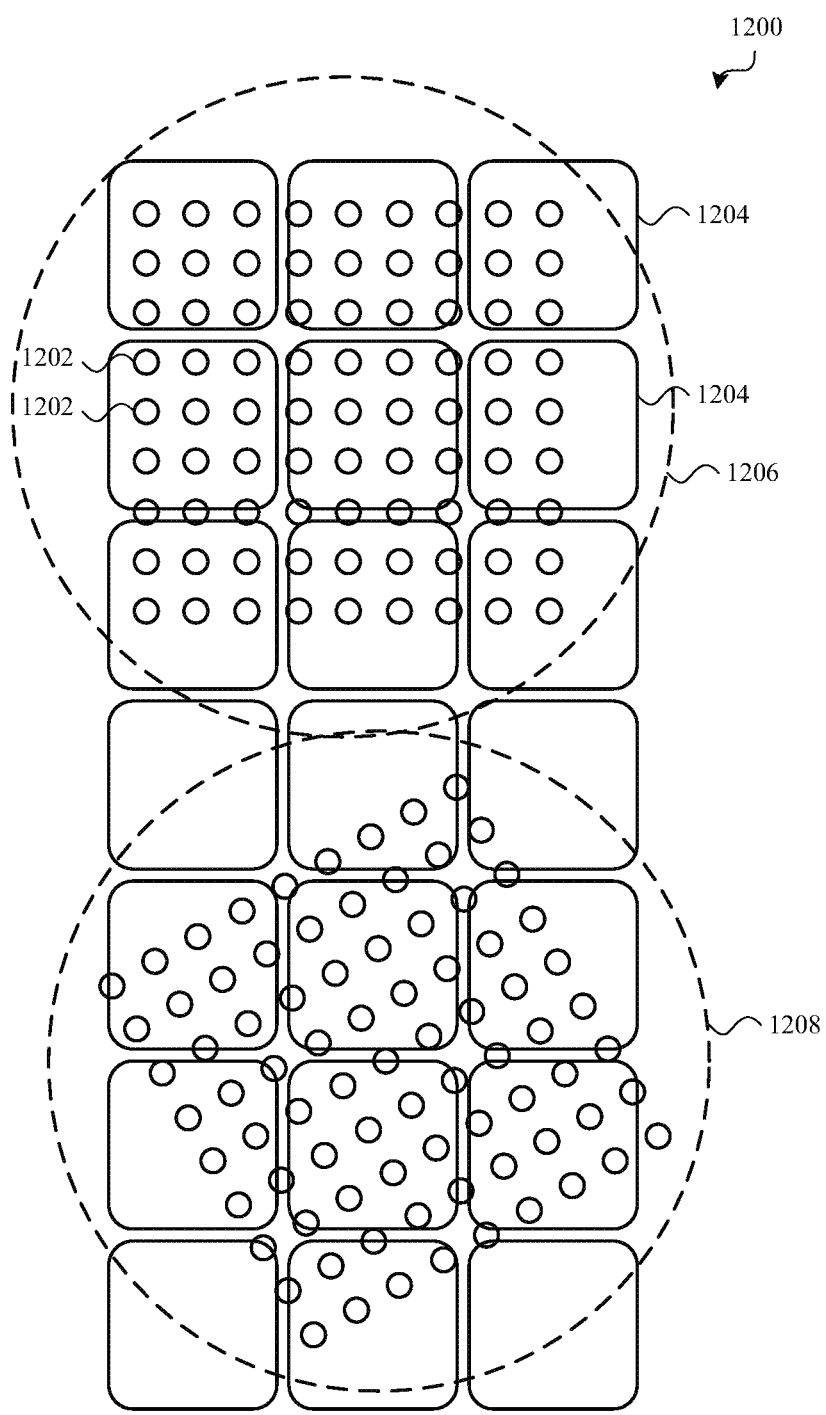
FIG. 12 shows an example plan view of a set of emitters included in an under-display optical modulate, in relation to an array of micro-optic elements.
Figure 13A:
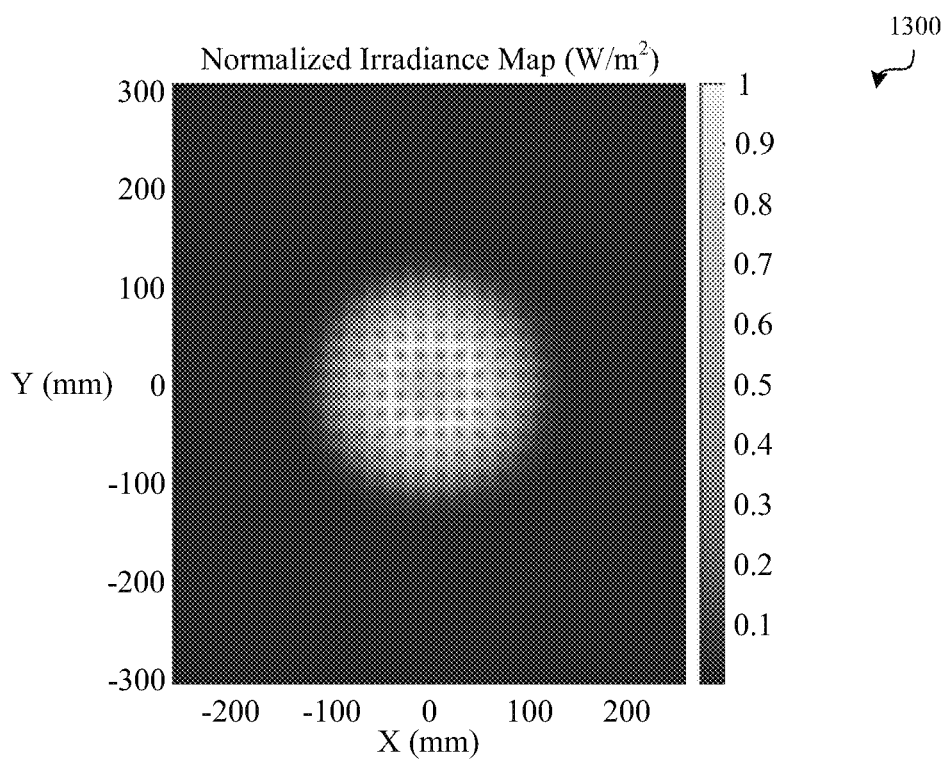
Figure 13B:
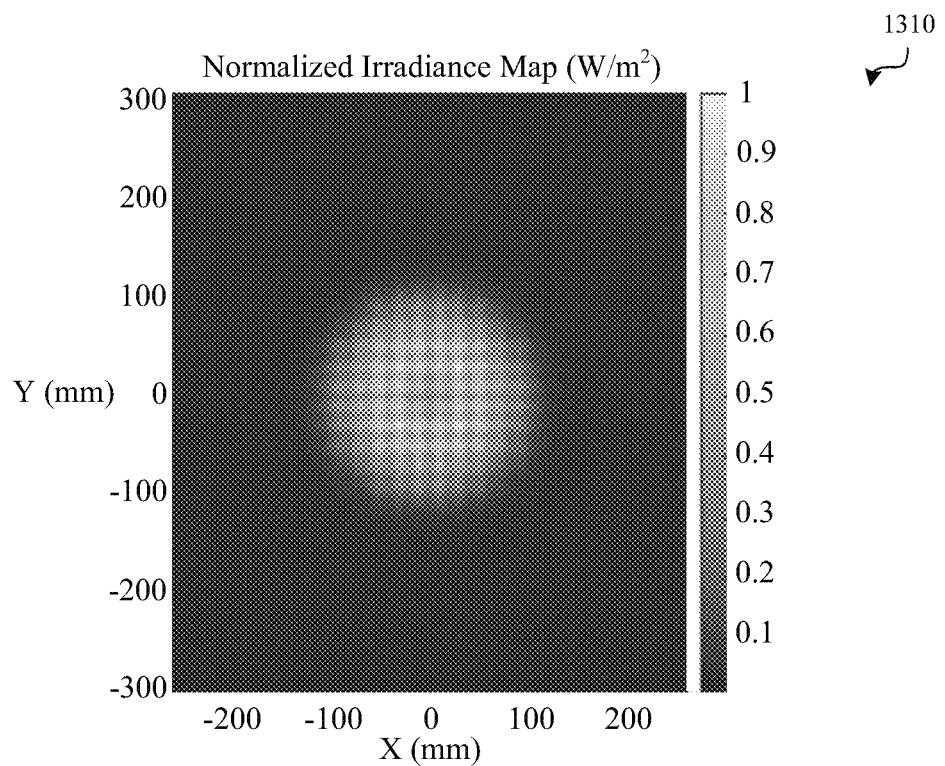
Figure 14:
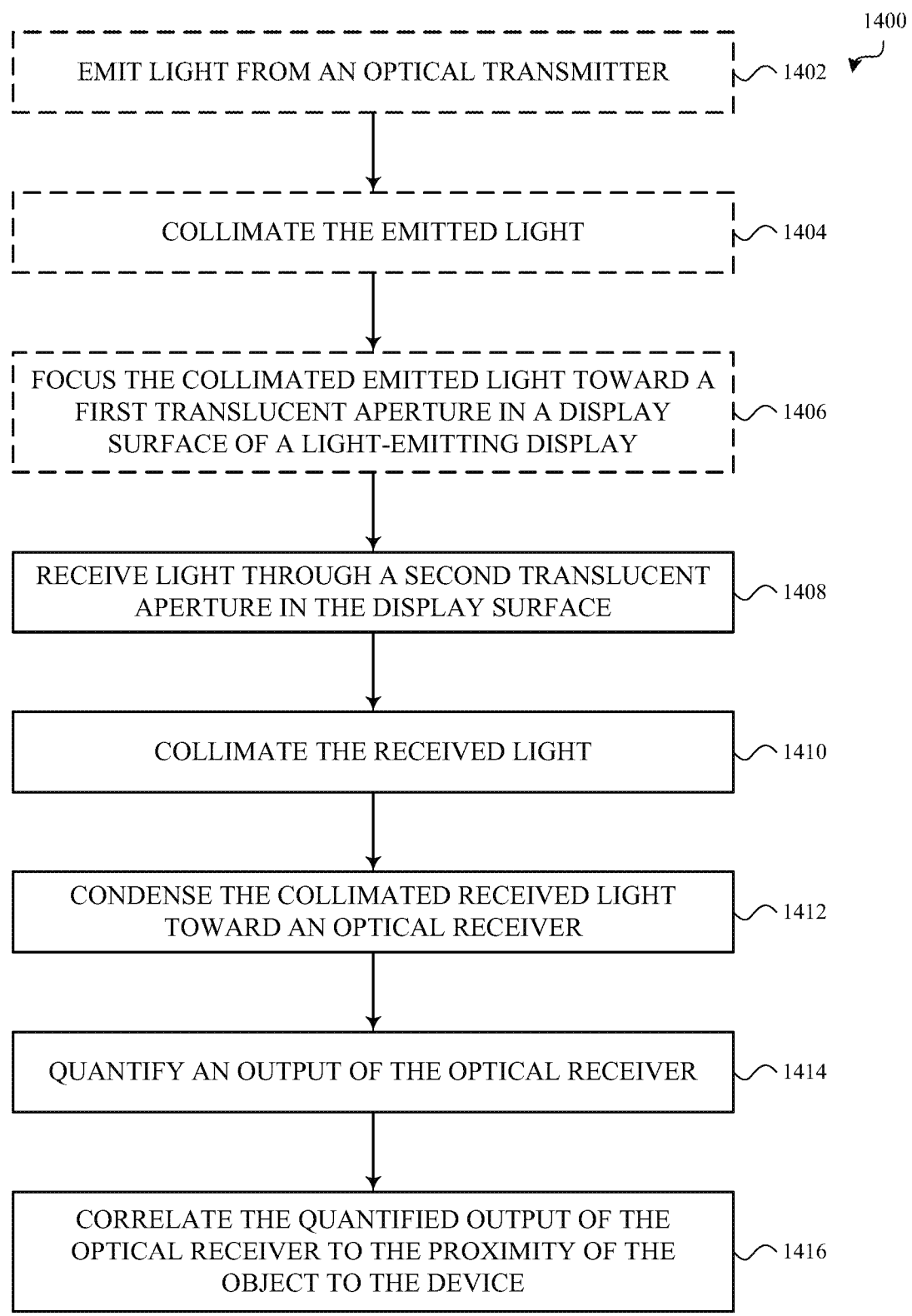
Figure 15:
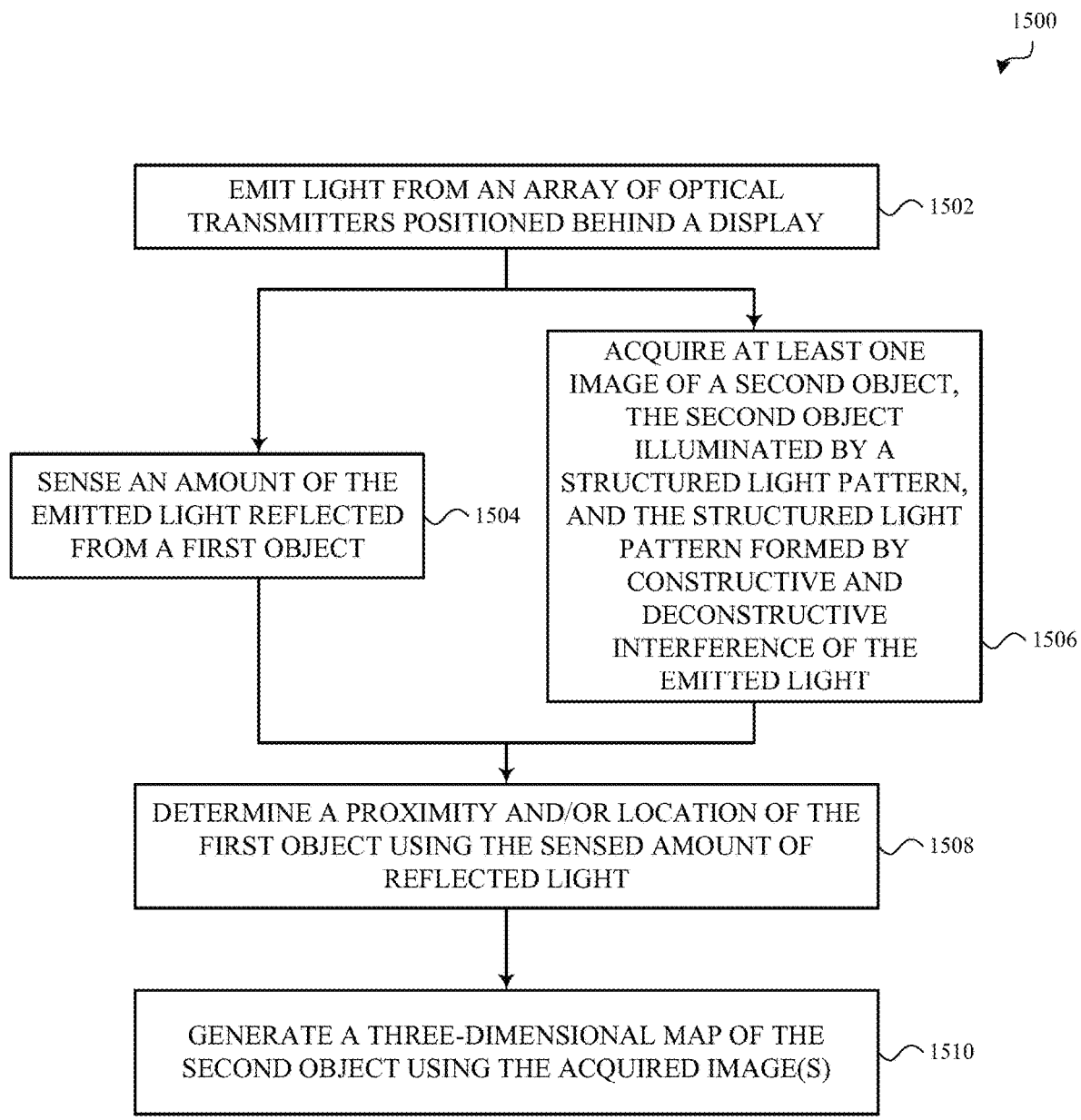

Each of FIGS. 13A and 13B depicts illumination (e.g., normalized irradiance) along x and y axes of a conjugated focal plane parallel to the a plane passing through the set of emitters or array of micro-optic elements described with reference to FIG. 12;

FIG. 14 illustrates an example method of sensing a proximity of an object to a device having a light-emitting display;

FIG. 15 illustrates an example method of illuminating a field of view; and

Figure 16:
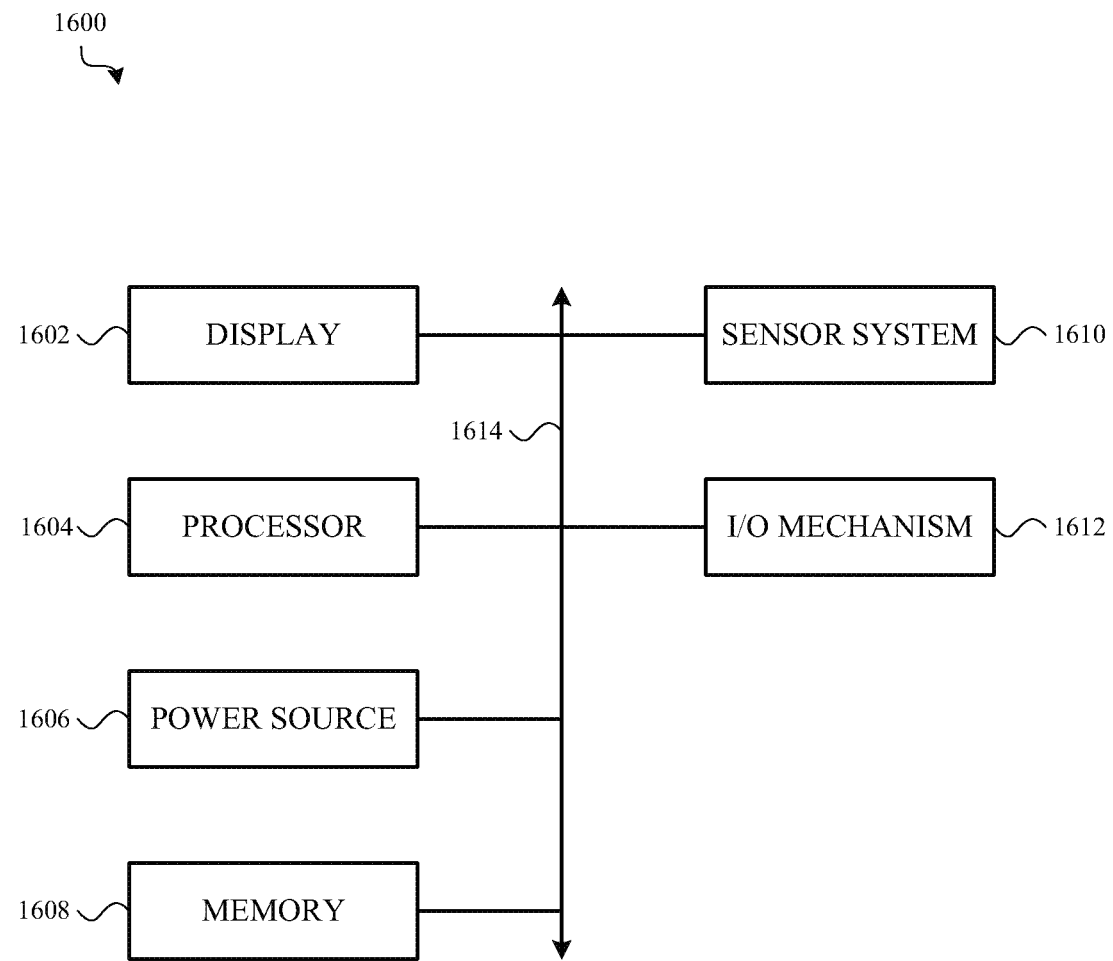

FIG. 16 shows an example electrical block diagram of an electronic device.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

The following disclosure relates to optical sensing, and more particularly to under-display optical sensing. When an optical sensor is positioned under a light-emitting display, a portion of the device's display surface does not have to be reserved for the optical sensor, and in some cases the size of the device's display may be increased. However, an impediment to positioning an optical sensor under a display is the inclusion of many opaque elements in the display's display stack. Opaque elements may include, for example, light-emitting elements, drive circuits, conductive traces that route electrical signals to the drive circuits, optical, electrical, physical, and/or chemical shielding or confining elements, and so on. For purposes of this disclosure, light-emitting elements are deemed to include semiconductor light-emitting elements, such as light-emitting diodes (LEDs); semiconductor-driven electroluminescent light-emitting elements, such as organic LEDs (LEDs) including organic materials charged by thin-film transistors; and other types of light-emitting elements.

The multiple layers of opaque elements in a display stack can reflect, absorb, diffuse, and diffract light entering the front or back surface of the display stack, and can provide high transmission loss (low throughput) for light passing through the display stack. In fact, the density of opaque elements in a display stack can make the display stack, as a whole, seem relatively opaque. In some cases, a display stack may allow approximately 1% of visible light to pass, and allow approximately 2-4% of infrared light to pass. One potential solution to this is to alternatively fabricate some of the display stack's opaque elements (e.g., the conductive traces) as transparent elements. For example, conductive traces may be made of indium-tin-oxide (ITO). However, transparent elements are often associated with a cost, such as higher sheet resistance. Furthermore, and in the case of an OLED display, a highly reflective surface is needed under the OLED emitter to maximize OLED optical extraction. Also, transparent conductive traces may allow organic material to be exposed to optical radiation from an under-display optical transmitter, which can cause the organic material to heat, glow, age, degrade, and so on.

Of particular concern for an under-display optical sensor, and especially an under-OLED display optical sensor, are the conductive traces (e.g., anode metal traces) that route electrical signals to the drive circuits for the light-emitting elements in the display stack. The conductive traces may provide power and control signals to the light-emitting elements (or pixels), and may read data from the pixels (e.g., from the thin-film transistor(s) (TFT(s)) of every pixel). The conductive traces are typically included in multiple layers of the display stack, and may be oriented in different directions (e.g., orthogonal or otherwise overlapping directions) such that they form a mesh of conductive traces. In some cases, the conductive traces may cover 85-95% of the surface area of a display stack, and may thus prevent light from passing through approximately 85-95% of a display stack. This greatly reduces the signal-to-noise ratio (SNR) and dynamic range of an optical sensor positioned in an under-display configuration. The conductive traces are not only opaque, but in many cases are highly reflective. This can generate significant crosstalk between an optical transmitter and optical receiver, or between the transmit and receive components of an optical transceiver, and may further reduce the SNR and dynamic range of an optical sensor. Still further, the regular pitch of the anode metal traces (usually equal to an integer or fraction of the display's pixel pitch) can make the mesh of anode metal traces an effective diffraction grating. Regardless, there exist translucent (and sometimes transparent) apertures between the conductive traces, and some of these translucent apertures typically extend from the front surface to the back surface of a display stack.

Of particular concern for an under-display optical sensor that includes near-infrared (NIR) under-display transmitters (i.e., optical transmitters that transmit wavelengths of light in the range of 700-1100 nm or beyond) is that, when TFTs in the display stack are exposed to transmitter backlighting, control and drive operations of the TFTs may be significantly altered-both transiently and long-term—by the photo-absorption of TFT poly-silicon layers and other sensitive layers. Spatially maximizing the transmit power of optical transmitters through a display stack's translucent apertures ("open" areas) and minimizing direct backlighting to the display stack's TFTs, can greatly mitigate the negative impact of under-display optical transmitters on display performance.

The present disclosure describes systems, devices, methods, and apparatus in which micro-optic elements (e.g., micro-lenses or gradient-index (GRIN) lenses) are formed on (or abutted to) the back surface of a display stack. The micro-optic elements may be aligned with the translucent apertures that already exist in a display stack (e.g., the micro-optic elements may be opportunistically aligned), or aligned with translucent apertures that are formed by deterministically routing conductive traces to provide translucent apertures of predetermined size at predetermined locations. In some cases, the micro-optic elements may be formed by exposing the front surface of a display stack to electromagnetic radiation (e.g., ultraviolet (UV) radiation) that passes through the translucent apertures to pattern a photoresist applied to the back surface of the display stack. In this manner, the micro-optic elements may be considered self-aligned by the display stack.

An under-display optical sensor may variously include an optical transmitter, an optical receiver, an optical transceiver, or multiple optical transmitters, optical receivers and/or optical transceivers. In some cases, multiple optical sensors may be provided under a device's display, and may be used to perform the same or different functions. An under-display optical sensor may be used, for example, as a proximity sensor (or ranging sensor), an ambient light sensor, a fingerprint sensor, a camera (2D or 3D), a wireless communicator or controller, a time-of-flight (ToF) sensor (e.g., a short pulse optical source and a single-photon avalanche-diode (SPAD) detector or SPAD array), and so on. One or more optical transmitters, without corresponding optical receives, may also be positioned under a display (e.g., for providing flood illumination, a flashlight, or an optical pointer (e.g., an infrared (IR) pointer)). In some embodiments, an optical transmitter and/or receiver may be provided under a display, and an optical transmitter and/or receiver may be provided adjacent the display.

The provision of an under-display optical sensor can maximize the display surface real-estate available for providing a display, and in some cases may enable an edge-to-edge display (i.e., a display that spans 100% of the display surface). Also, the display-integrated micro-optic elements described herein can enhance through-display optical transmission, reduce display back-reflection and diffraction, reduce backlighting-induced display distortion, and improve through-display optical reception efficiency.

These and other embodiments are discussed with reference to FIGS. 1A-15. However, those skilled in the art will readily appreciate that the detailed description given herein with respect to these figures is for explanatory purposes only and should not be construed as limiting.

Figure 1A:
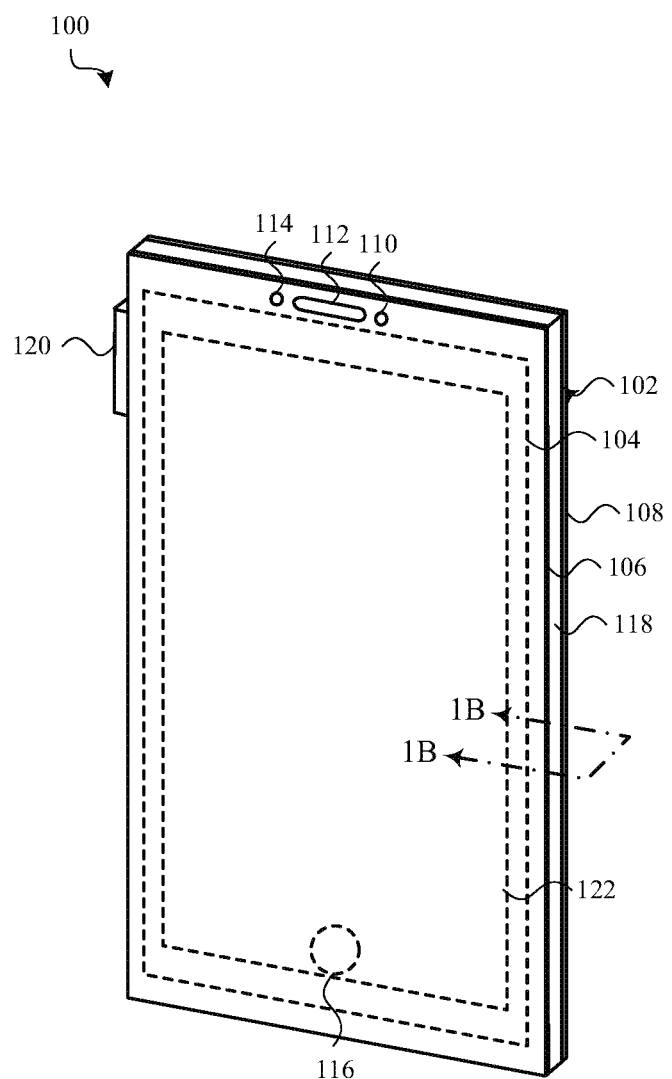
FIGS. 1A & 1B show an example embodiment of a device having a display.
Figure 1B:
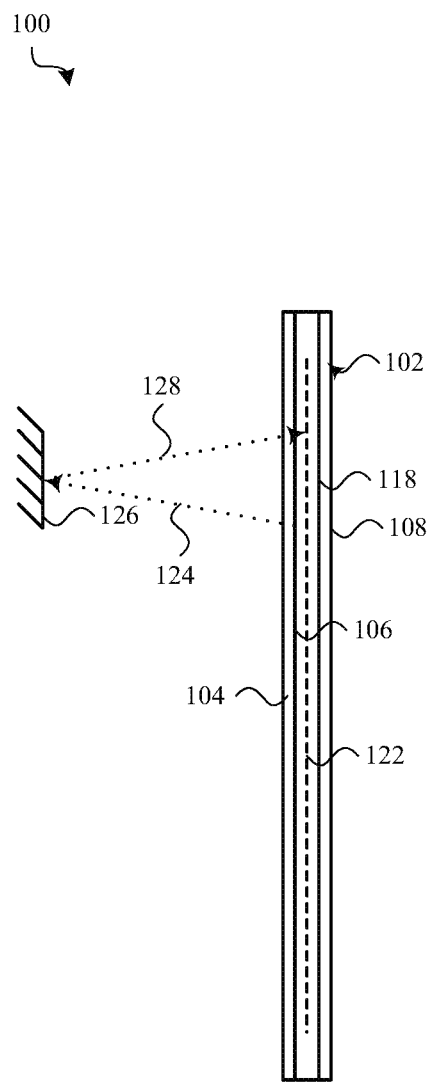

FIGS. 1A and 1B show an example of a device 100 having a display 104. More particularly, FIG. 1A shows a perspective view of the front of the device 100, and FIG. 1B shows an elevation of a side of the device 100. The device's dimensions and form factor, including the ratio of the length of its long sides to the length of its short sides, suggest that the device 100 is a mobile phone (e.g., a smartphone). However, the device's dimensions and form factor are arbitrarily chosen, and the device 100 could alternatively be any portable electronic device including, for example, a mobile phone, tablet computer, portable computer, portable music player, health monitoring device, portable terminal, or other portable or mobile device. The device 100 could also be a device that is semi-permanently located or installed at a single location.

The device 100 may include a housing 102 that at least partially surrounds or supports a display 104. In some examples, the housing 102 may include or support a front cover 106 and/or a rear cover 108. The front cover 106 may be positioned over the display 104, and may provide a window through which the display 104 may be viewed. In some embodiments, the display 104 may be attached to (or abut) the housing 102 and/or the front cover 106.

As shown primarily in FIG. 1A, the device 100 may include various other components. For example, the front of the device 100 may include one or more front-facing cameras 110, speakers 112, microphones, or other components 114 (e.g., audio, imaging, or sensing components) that are configured to transmit or receive signals to/from the device 100. In some cases, a front-facing camera 110, alone or in combination with other sensors, may be configured to operate as a bio-authentication or facial recognition sensor. The device 100 may also include various input devices, including a mechanical or virtual button 116, which may be accessible from the front surface (or display surface) of the device 100. In some cases, the front-facing camera 110, virtual button 116, and/or other sensors of the device 100 may be integrated with a display stack of the display 104 and moved under the display 104.

The device 100 may also include buttons or other input devices positioned along a sidewall 118 of the housing 102 and/or on a rear surface of the device 100. For example, a volume button or multipurpose button 120 may be positioned along the sidewall 118, and in some cases may extend through an aperture in the sidewall 118. By way of example, the rear surface of the device 100 may include a rear-facing camera or other optical sensor. A flash or light source may also be positioned along the rear of the device 100 (e.g., near the rear-facing camera). In some cases, the rear surface of the device 100 may include multiple rear-facing cameras.

The display 104 may include one or more light-emitting elements including, for example, LEDs, OLEDs, a liquid crystal display (LCD), an electroluminescent display (EL), or other types of light-emitting elements. The display 104 may also include, or be associated with, one or more touch and/or force sensors that are configured to detect a touch and/or a force applied to a surface of the front cover 106.

The various components of the housing 102 may be formed from the same or different materials. For example, the sidewall 118 may be formed using one or more metals (e.g., stainless steel), polymers (e.g., plastics), ceramics, or composites (e.g., carbon fiber). In some cases, the sidewall 118 may be a multi-segment sidewall including a set of antennas. The antennas may form structural components of the sidewall 118. The antennas may be structurally coupled (to one another or to other components) and electrically isolated (from each other or from other components) by one or more non-conductive segments of the sidewall 118. The front cover 106 may be formed, for example, using one or more of glass, a crystal (e.g., sapphire), or a transparent polymer (e.g., plastic) that enables a user to view the display 104 through the front cover 106. In some cases, a portion of the front cover 106 (e.g., a perimeter portion of the front cover) may be coated with an opaque ink to obscure components included within the housing 102. The rear cover 108 may be formed using the same material(s) that are used to form the sidewall 118 or the front cover 106. In some cases, the rear cover 108 may be part of a monolithic element that also forms the sidewall 118 (or in cases where the sidewall 118 is a multi-segment sidewall, those portions of the sidewall 118 that are non-conductive). In still other embodiments, all of the exterior components of the housing 102 may be formed from a transparent material, and components within the device 100 may or may not be obscured by an opaque ink or opaque structure within the housing 102.

The front cover 106 may be mounted to the sidewall 118 to cover an opening defined by the sidewall 118 (i.e., an opening into an interior volume in which various electronic components of the device 100, including the display 104, may be positioned). The front cover 106 may be mounted to the sidewall 118 using fasteners, adhesives, seals, gaskets, or other components.

A display stack or device stack (hereafter referred to as a "stack") including the display 104 may be attached (or abutted) to an interior surface of the front cover 106 and extend into the interior volume of the device 100. In some cases, the stack may include a touch sensor (e.g., a grid of capacitive, resistive, strain-based, ultrasonic, or other type of touch sensing elements), or other layers of optical, mechanical, electrical, or other types of components. In some cases, the touch sensor (or part of a touch sensing system) may be configured to detect a touch applied to an outer surface of the front cover 106 (e.g., to a display surface of the device 100).

In some cases, a force sensor (or part of a force sensing system) may be positioned within the interior volume below and/or to the side of the display 104. The force sensor (or force sensing system) may be triggered in response to the touch sensor detecting one or more touches on the front cover 106 (or a location or locations of one or more touches on the front cover 106), and may determine an amount of force associated with each touch, or an amount of force associated with the collection of touches as a whole.

In some embodiments, one or more micro-optic elements may be formed on (or abutted to) a back surface 122 of the display stack, under the display 104. Each of the micro-optic elements may be respectively aligned with one or more (i.e., one or multiple) translucent apertures that extend from a front surface to the back surface 122 of the display stack. Some or all of the micro-optic elements may focus light emitted by one or more under-display optical transmitters in one or more of the translucent apertures, to increase the percentage of light that passes through the translucent apertures, reduce TFT exposure to backlighting, and reduce back reflections. Also or alternatively, some or all of the micro-optic elements may collimate light received through the translucent apertures, so that the light does not scatter behind the display and can be focused onto one or more optical receivers, thereby increasing the light collection efficiency of the device 100.

FIG. 1B shows light 124 being emitted from an optical transmitter positioned behind the back surface 122 of the display stack of the device 100. The emitted light 124 may travel from the back surface 122 toward the front cover 106, and may pass through the front cover 106. After passing through the front cover 106, the emitted light 124 may travel toward an object 126, such as a user's ear, reflect from the object 126, and travel back toward the device 100 as reflected light 128. The reflected light 128 may pass through the display stack and be received by an optical receiver positioned behind the back surface 122 of the display stack. A processor of the device 100 may then determine a proximity of the object 126 to the device 100. The processor may also or alternatively make other determinations, based on light emitted and received by the device 100, or based on light received (but not emitted) by the device 100.

Figure 2A:
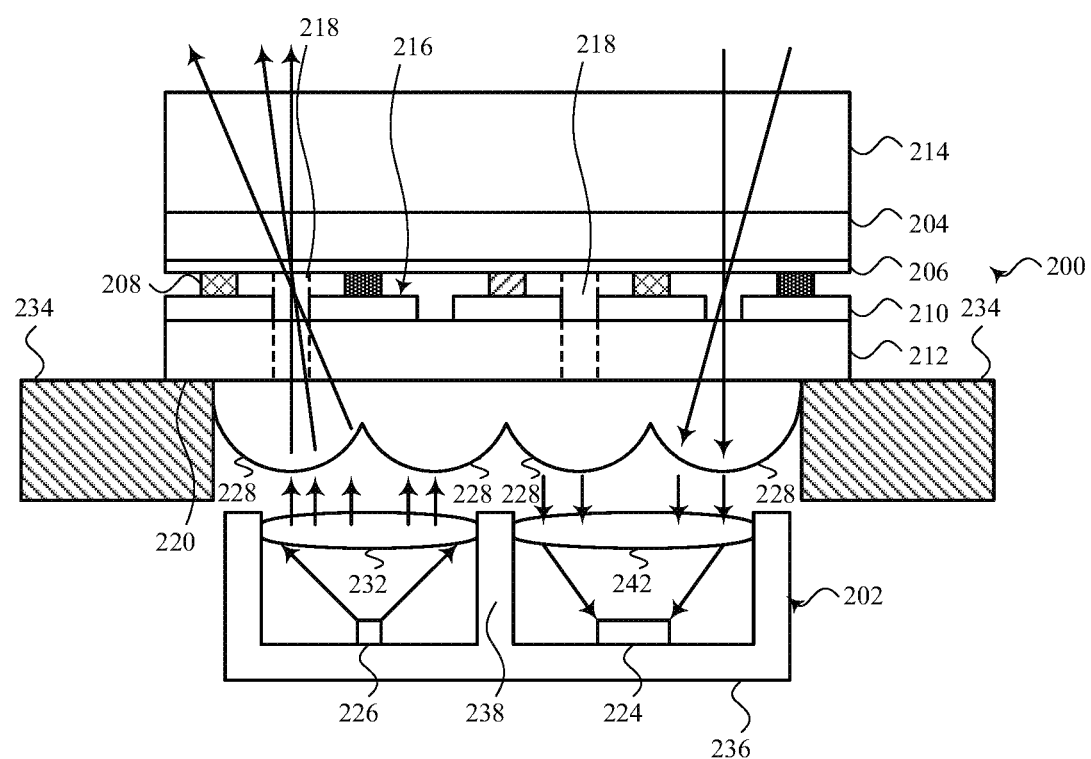
FIGS. 2A and 2B show an example embodiment of a display stack and optical module.
Figure 2B:
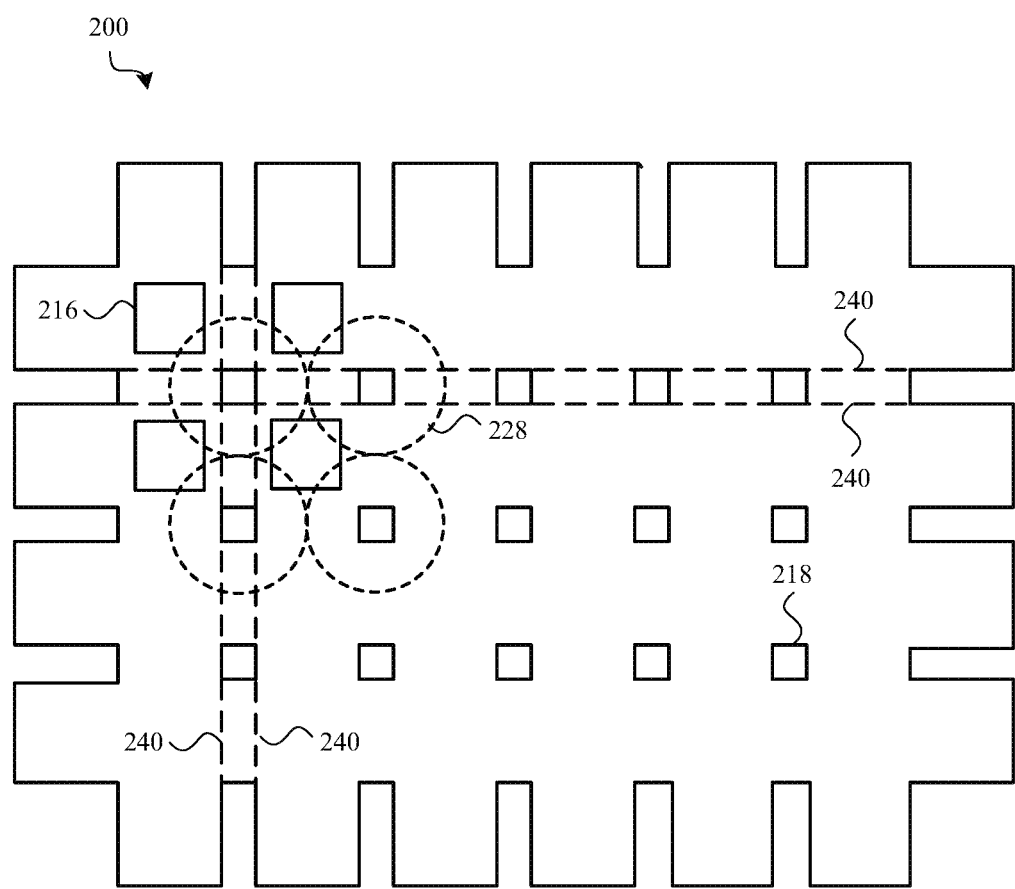

FIGS. 2A and 2B show an example embodiment of a display stack 200 and optical module 202. In some cases, the display stack 200 and optical module 202 may be included in the device 100 described with reference to FIGS. 1A and 1B. FIG. 2A shows an elevation of the display stack 200 and optical module 202, and FIG. 2B shows a plan view of the display stack 200 (with the optical module 202 being hidden from view by the display stack 200).

The display stack 200 may be attached or abutted to a cover 214 (e.g., a glass cover or "cover glass"), and may include multiple layers (e.g., layers 204, 206, 208, 210, and 212). In other words, the display stack 200 may be a multi-layer display stack 200. The layers 204-212 of the display stack 200 may include a set of opaque elements. The opaque elements may variously include a set of light-emitting elements 216 (e.g., a set of OLEDs in a light-emitting layer 208 (e.g., an organic layer)), a set of drive circuits (e.g., a set of TFTs in a drive layer 210, which TFTs may be employed as OLED drive circuits to drive the set of light-emitting elements 216 (e.g., the set of OLEDs in the light-emitting layer 208), a set of conductive traces in one or more layers 212 (e.g., bottom high reflectors for the light-emitting elements 216, electrical contacts for the drive circuits in the drive layer 210, and/or interconnect traces for the drive circuits), optical, electrical, physical, and/or chemical shielding or confining elements, and so on. Different opaque elements may be included in the same or different layers, and in some cases may span two or more layers. The display stack 200 may also include a set of materials associated with partial transmission, absorption, and/or reflection of optical wavelengths of interest, and/or a set of opaque and/or transparent materials, such as dielectric material between the light-emitting elements, a cathode electrode in a cathode layer 206, and a polarizer, touch sensor electrodes, and/or other elements in one or more layers 204.

The conductive traces in layer(s) 212 may be configured to route electrical signals for (i.e., to and/or form) the drive circuits in the drive layer 210 (e.g., to and/or from the TFTs in the drive layer 210). In some cases, the conductive traces may be made of metal, such as copper, gold, silver, aluminum, or a metal alloy. The conductive traces may form a multi-layer mesh of conductive traces in the layers 212. For example, the conductive traces in a first one or more layers may extend substantially parallel to one another in a first direction, and the conductive traces in a second one or more layers may extend substantially parallel to one another in a second direction, orthogonal to the first direction. In some embodiments, the back surfaces of the conductive traces (or both the front surfaces and the back surfaces of the conductive traces) may be treated to reduce their reflectivity. For example, an opaque ink or other layer may be applied to the back surface of the layers 212 (or to the front and back surfaces of the layers 212), but for the openings to the translucent apertures 218. Alternatively, the conductive traces, or a dielectric that covers the layers 212, may be coated or treated to reduce the reflectivity of the display stack 200, but for the openings to the translucent apertures 218. Such an ink, roughening, or other treatment may also help to reduce optical crosstalk between an optical transmitter and optical receiver positioned under the display stack 200.

The set of opaque elements may define one or more translucent apertures 218. The translucent apertures 218 may extend through the display stack 200 (e.g., from a front surface (or user-facing surface) of the display stack 200 to a back surface of the display stack 200). For example, a translucent aperture 218 having a rectangular or square cross-section may be bounded on a first set of opposite sides by conductive traces in a first set of one or more layers of the display stack 200, and on a second set of opposite sides by conductive traces in a second set of one or more layers of the display stack 200. In some cases, other opaque elements (e.g., light-emitting elements 216, optical, electrical, physical, and/or chemical shielding or confining elements, and so on) may also or alternatively bound and define a translucent aperture 218. In some cases, part or all of a translucent aperture 218 may be filled by a dielectric (or multiple dielectrics) used to form one or more substrate or intermediate layers on which (or in which) the opaque elements are formed. The dielectric(s) may allow light having one or more predetermined wavelengths to pass through a translucent aperture 218. In some cases, light within a predetermined range of wavelengths, or light of any wavelength, may pass through a translucent aperture 218. In some embodiments, a translucent aperture 218 may be transparent to some or all of the wavelengths of light that it passes.

In some embodiments, the set of opaque elements may include elements that are opaque to some wavelengths of light (e.g., opaque to visible, infrared, and/or other wavelengths of light), but translucent or transparent to other wavelengths of light. As used herein, the term "light" is broadly used to refer to visible and invisible forms of electromagnetic radiation.

The translucent apertures 218 in the display stack 200 may be evenly or unevenly distributed across the display stack 200. The translucent apertures 218 may have the same or different sizes (e.g., dimensions). Different subsets of the display stack's opaque elements may define different ones of the translucent apertures 218. In some cases, the display stack 200 may include translucent apertures 218 that are slanted with respect to the front and back surfaces of the display stack 200 (i.e., translucent apertures 218 that intersect the front and back surfaces of the display sack 200 at other than a ninety degree angle). In some cases, a slanted aperture may intersect one or more perpendicular apertures.

The optical module 202 may be positioned behind the back surface 220 of the display stack 200, and may be spaced apart from the back surface 220 of the display stack 200 (e.g., positioned in a plane parallel to the back surface 220 of the display stack 200, and facing the back surface 220 of the display stack 200). The optical module 202 may include an optical receiver 224 and/or an optical transmitter 226, and in some cases may include multiple optical receivers and/or optical transmitters (or an optical transceiver). Alternatively, a plurality of optical modules may be positioned behind and spaced apart from the back surface 220 of the display stack 200, with each optical module including an optical receiver, an optical transmitter, or both (e.g., an optical transceiver).

At least one micro-optic element 228 (e.g., one or more micro-lenses or GRIN lenses) may be formed on the back surface 220 of the display stack 200, between the display stack 200 and the optical module 202. Each micro-optic element 228 may have a focal point located within, aligned with, or near one of the translucent apertures 218.

The optical receiver 224 may be positioned to receive light through the display stack 200 (e.g., through one or more of the translucent apertures 218) and at least a first of the micro-optic elements 228. In some cases, the optical module 202 may include a condensing lens 242 positioned between the at least first micro-optic element 228 and the optical receiver 224.

In some embodiments, the optical receiver 224 may receive light through at least first and second translucent apertures 218, which apertures are respectively aligned with first and second micro-optic elements 228 having focal points located within, aligned with, or near the first and second translucent apertures 218. In these embodiments, the optical receiver 224 may be configured to receive light through the first translucent aperture 218 and the first micro-optic element 228, and through the second translucent aperture 218 and the second micro-optic element 228. Receiving light through more translucent apertures 218 can increase the light collection capability of the optical receiver 224 and increase SNR.

The optical transmitter 226 may be positioned to transmit light through at least a second micro-optic element 228 and the display stack 200 (e.g., through one or more of the translucent apertures 218). In some cases, the optical module 202 may include a collimating lens 232 positioned between the optical transmitter 226 and the at least second micro-optic element 228.

In some embodiments, the optical transmitter 226 may transmit light through at least first and second translucent apertures 218, which apertures are respectively aligned with first and second micro-optic elements 228 having focal points located within, aligned with, or near the first and second translucent apertures 218. In these embodiments, the optical transmitter 226 may be configured to transmit light through the first translucent aperture 218 and the first micro-optic element 228, and through the second translucent aperture 218 and the second micro-optic element 228. Transmitting light through more translucent apertures 218 can increase the transmission power.

In some embodiments, the display stack 200 may be mounted to a backplate 234 (or vice versa). The optical module 202 may also be mounted to the backplate 234. As shown, the optical module 202 may include a substrate 236 having one or more walls extending perpendicularly therefrom. The walls may be used to mount the optical module to the backplate 234 or to the display stack 200. A wall 238 may be provided between the optical receiver 224 and optical transmitter 226, or walls may surround each of the optical receiver 224 and optical transmitter 226, to mitigate optical crosstalk between the optical receiver 224 and optical transmitter 226. Optical crosstalk may occur, for example, when light emitted by the optical transmitter 226 reflects from the micro-optic elements 228, a layer of the display stack 200, or the cover 214, and impinges on the optical receiver 224 before first exiting the cover 214.

As previously mentioned, FIG. 2B shows a plan view of the display stack 200. By way of example, the display stack 200 is shown to include a mesh of conductive traces 240 (e.g., conductive traces that cross over or under other traces in other layers of the display stack 200). Only some of the conductive traces 240 are specifically shown in FIG. 2B.

The display stack 200 also includes light-emitting elements 216, and in some cases may include other elements. The conductive traces 240 may be opaque, such that light (or light of a desired wavelength) is only able to pass through the display stack 200 between the conductive traces 240. In some cases, the mesh of conductive traces 240 may be the primary opaque elements that define the bounds of a plurality of translucent apertures 218 extending from the front surface to the back surface of the display stack 200. However, other opaque elements may also define portions of some or all of the translucent apertures 218.

An array of micro-optic elements 228 may be aligned with some or all of the translucent apertures 218. For example, in some cases, a micro-lens array may be formed on the back surface of the display stack 200. Each micro-lens in the array may have a focal point located within, aligned with, or near one of the translucent apertures 218.

The layout of the conductive traces 240 shown in FIG. 2B is optimized to provide somewhat larger, more equally spaced, and linear translucent apertures 218 through the display stack 200. Such an optimized layout of conductive traces 240 can make it easier to form an array of micro-optic elements 228 on the back surface of the display stack 200 (e.g., an array of same size micro-lenses). However, in some cases, the conductive traces 240 in a display stack 200 may not have an optimized layout, as shown in FIG. 3.

Figure 3:
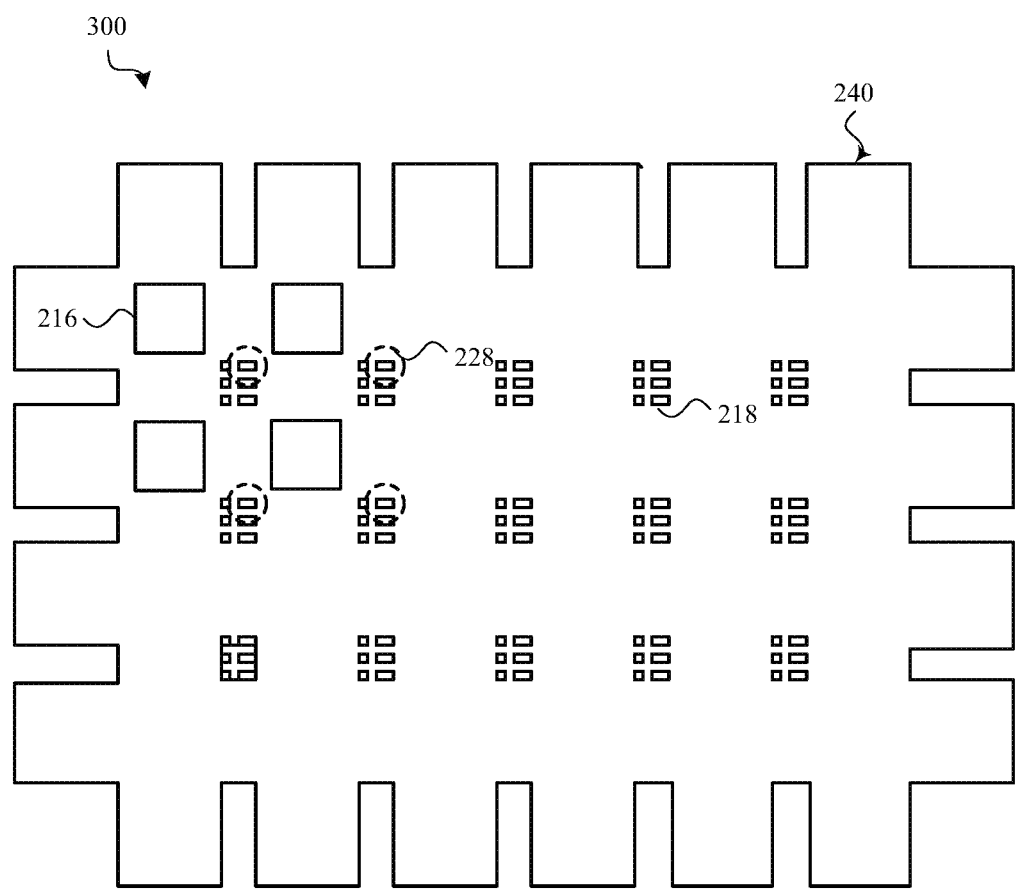
FIG. 3 shows an alternative plan view of the display stack described with reference to FIGS. 2A and 2B.

FIG. 3 shows an alternative plan view of the display stack 200 described with reference to FIGS. 2A and 2B. Similarly to the display stack 200 shown in FIG. 2B, the display stack 200 shown in FIG. 3 includes a mesh of conductive traces 240. The display stack 200 also includes light-emitting elements 216, and in some cases may include other elements. However, in contrast to the layout described with reference to FIG. 2B, the opaque elements of the light-emitting layer 208, drive layer 210, and layers 212 of conductive traces 240 shown in FIG. 3 are not optimized and the translucent apertures 218 in the display stack 200 have varying sizes (e.g., different widths, different lengths, and so on). The different sizes are due to variances in the spacing and density of the conductive traces 240, in combination with the overlapping shapes opaque elements in the light-emitting layer 208 and drive layer 210, which variances may be due to the positions of thin-film transistors and their connections, and other components associated with the light-emitting elements 216.

An array of micro-optic elements 228 may be aligned with some or all of the translucent apertures 218, with the different micro-optic elements 228 of the array having the same or different sizes. In some cases, micro-optic elements 228 of smaller size (e.g., smaller diameter) may be formed on (or abutted to) the back surface of the display stack 200 and aligned with smaller size translucent apertures. Similarly, micro-optic elements 228 of larger size (e.g., larger diameter) may be formed on (or abutted to) the back surface of the display stack 200 and aligned with larger size translucent apertures 218. Additionally or alternatively, a collection of multiple micro-optic elements 228 may be formed on (or abutted to) the back surface of the display stack 200 and tiled over a single translucent aperture 218. Similarly, a single micro-optic element 228 may be formed on (or abutted to) the back surface of the display stack 200 and span (or cover, or be aligned with) a collection of multiple translucent apertures 218.

Figure 4:
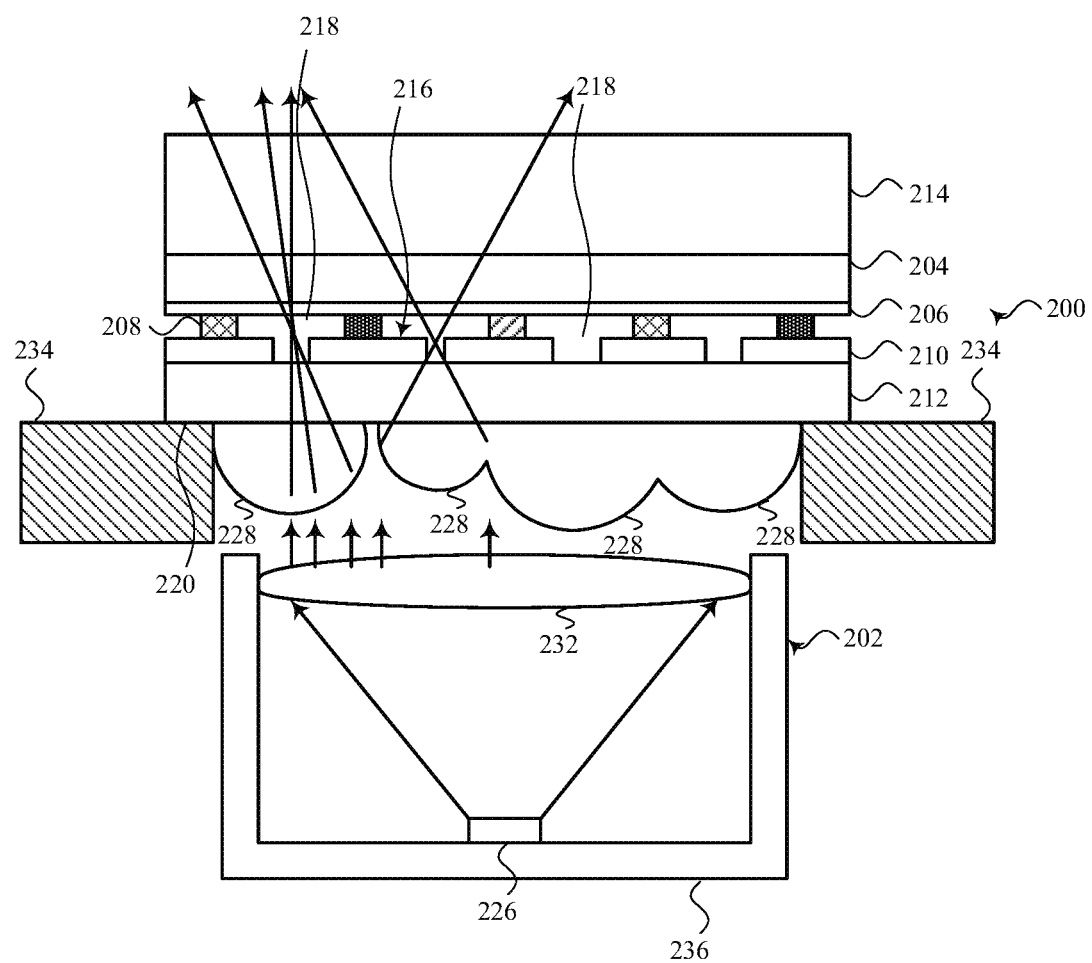
FIG. 4 shows an alternative elevation of the display stack shown in FIGS. 2A and 2B, with an alternative configuration of optical module.

FIG. 4 shows an alternative elevation of the display stack 200 shown in FIGS. 2A and 2B, with an alternative configuration of optical module 202. The alternative elevation is similar to the elevation shown in FIG. 2A, but has micro-optic elements 228 of different size formed on (or abutted to) the back surface 230 of the display stack 200. By way of example, the micro-optic elements 228 are shown to be micro-lenses having different diameters.

In some cases, the micro-optic elements 228 may be sized differently to focus or distribute more or less light in different portions of a field or view (e.g., to shape a beam or beams of light emitted into the field of view). In some cases, the size or dimensions of different translucent apertures 218 may differ, and the micro-optic elements 228 aligned with differently sized translucent apertures 218 may be sized differently to ensure that the focal points of differently sized micro-optic elements 228 are all located at a same or desired position with the differently sized translucent apertures 218. Alternatively, different micro-optic elements 228 may be sized differently to move the focal points of different micro-optic elements 228 to different locations, within or outside a translucent aperture 218. For example, a first translucent aperture 218 may have a first aperture size, and a second translucent aperture 218 may have a second aperture size, different from the first aperture size. In these embodiments, a first micro-optic element 228 may be aligned with the first translucent aperture 218 and have a first size, and a second micro-optic element may be aligned with the second translucent aperture 218 and have a second size. Parameters of one or more micro-optic elements 228 (e.g., focal points, numerical apertures (NAs), and so on) may be adjusted to provide a uniform or non-uniform distribution of light (or more or less uniform distribution of light) at a particular distance from the front surface of the display stack 200.

The optical module 202 may be similar to the optical module described with reference to FIG. 2A, but by way of example is shown to only include an optical transmitter 226. Also, the optical transmitter 226 is shown to receive light through a greater number of translucent apertures 218 and micro-optic elements 228.

In some embodiments, beams emitted through the display stack 200 may be further or alternatively shaped by elements included in one or more layers of the display stack 200. In some cases, these elements may be wavelength-targeted, such that they shape light having one or more predetermined wavelengths, but have no effect on other light (e.g., no effect on the visible light emitted by the light-emitting elements 216).

Figure 5:
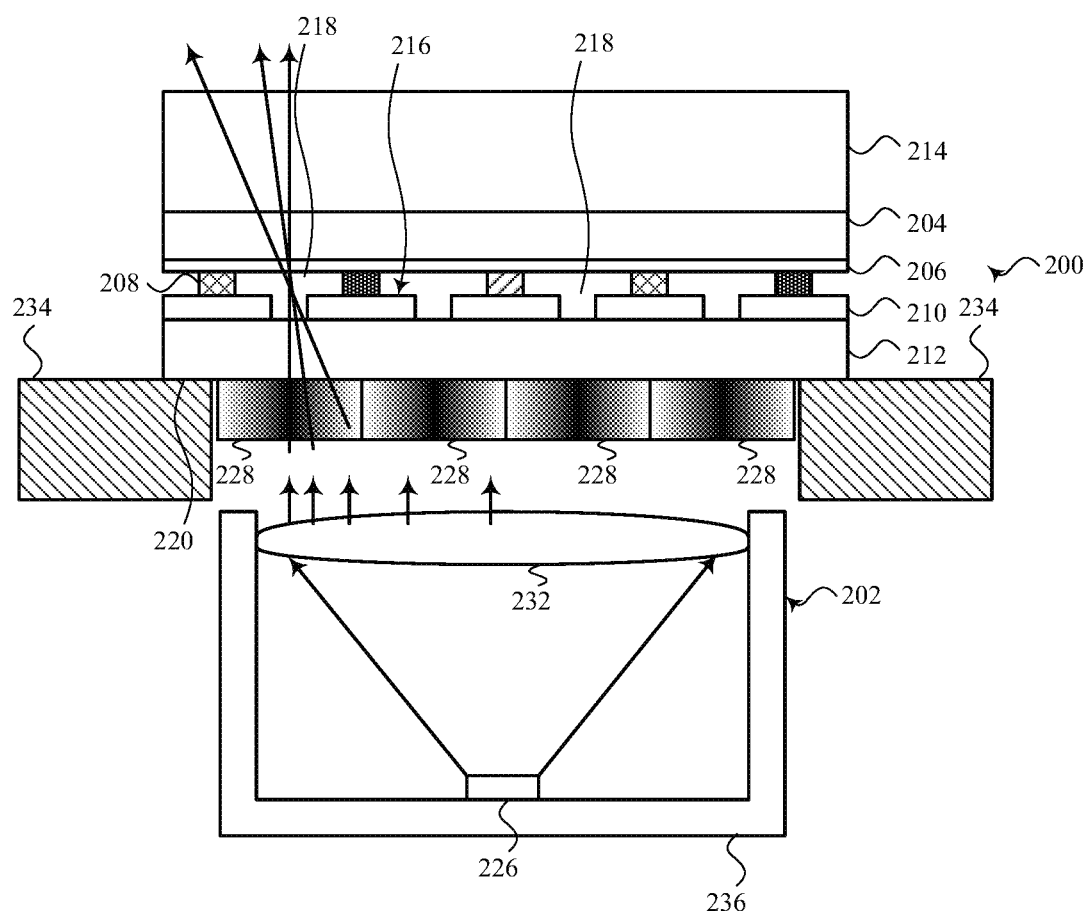
FIG. 5 shows another alternative elevation of the display stack shown in FIGS. 2A and 2B, with an optical module configured as described with reference to FIG. 4.

FIG. 5 shows another alternative elevation of the display stack 200 shown in FIGS. 2A and 2B, with an optical module 202 configured as described with reference to FIG. 4. The alternative elevation is similar to the elevation shown in FIG. 2A, but has micro-optic elements 228 in the form of a GRIN lens array (instead of a micro-lens array) formed on (or abutted to) the back surface 220 of the display stack 200. A GRIN lens may have a changing optical index, such as an optical index that changes from the periphery to the center of the lens. The changing optical index can bend light in different ways as it passes through the lens.

Flat optics, such as GRIN lenses, can be fabricated by using the conductive traces of the display stack 200 as a mask for performing ion implantation. The beam shaping provided by GRIN lenses can be customized, for example, by changing the index profile, thickness, and/or z-position of a GRIN lens.

In alternatives to what is shown in FIG. 5, the micro-optic elements 2 12828 could include Fresnel lenses, diffractive optic elements, and so on. In some embodiments, micro-optic elements 228 may be integrated into existing layers of the display stack 200 or included in additional layers of the display stack 200 (e.g., within the translucent apertures 218). Flat optics are sometimes easier to integrate into a layer of a display stack.

Figure 6:
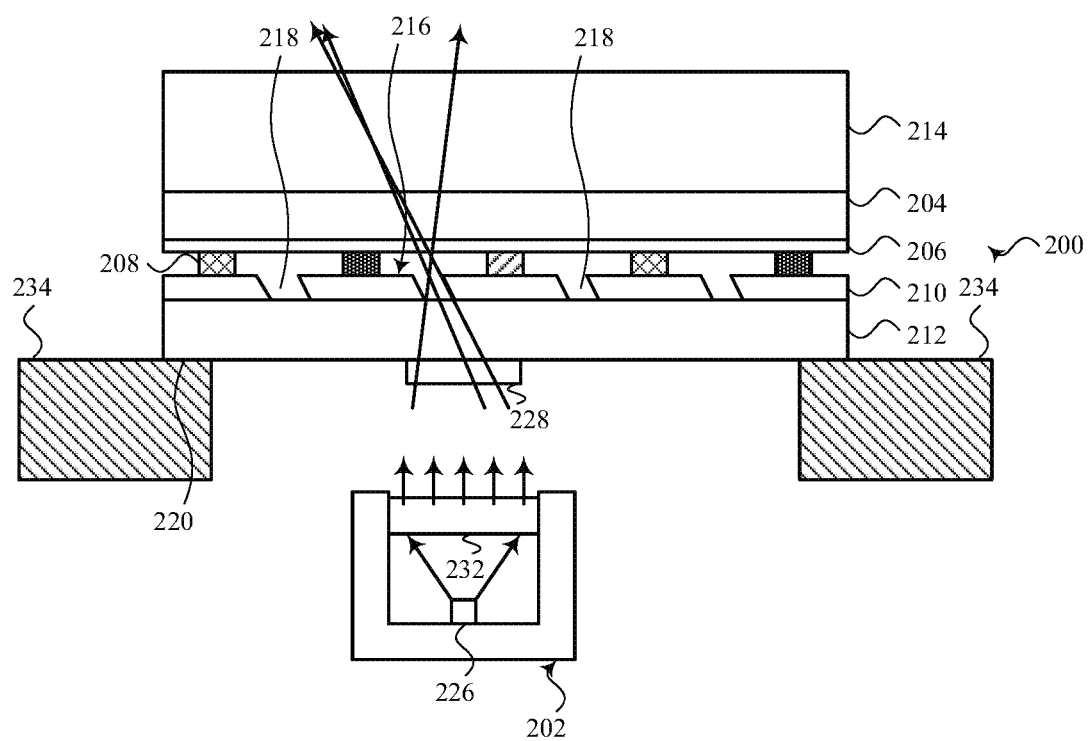
FIG. 6 shows yet another alternative elevation of the display stack shown in FIGS. 2A and 2B, in which light may be emitted or received through a slanted translucent aperture in the display stack.

FIG. 6 shows yet another alternative elevation of the display stack 200 shown in FIGS. 2A and 2B, in which light may be emitted or received through a slanted translucent aperture 218 in the display stack 200. The slanted translucent aperture 218 may have an axis that extends from the front surface to the back surface of the display stack 200 at an angle other than a 90 degree angle (i.e., the slanted translucent aperture 218 is not perpendicular to the front and rear surfaces of the display stack 200). The slanted translucent aperture 218 may be bounded by (and defined by) opaque elements in the display stack 200 similarly to the translucent apertures described with reference to FIGS. 2A, 2B, 3, 4, and 5.

An optical module 202 may be positioned behind the back surface 220 of the display stack 200 and spaced apart from the back surface 220 of the display stack 200 (e.g., positioned in a plane parallel to the back surface 220 of the display stack 200 and facing the back surface 220 of the display stack 200). The optical module 202 may include an optical receiver and/or an optical transmitter, but in FIG. 6 is shown to only include an optical transmitter 226. In some cases, the optical module 202 may include a lens 232. A micro-optic element 228 may be formed on the back surface 220 of the display stack 200, between the display stack 200 and the optical module 202. The micro-optic element 228 may be aligned, or at least partially aligned with, an end of the slanted translucent aperture 218.

When the optical module includes an optical transmitter 226, the micro-optic element 228 and/or the lens 232 may be configured to redirect (e.g., bend and collimate, or steer) light emitted by the optical transmitter 226 so that it can be emitted through the slanted translucent aperture 218. When the optical module 202 includes an optical receiver, the micro-optic element 228 and/or the lens 232 may be configured to redirect (e.g., bend and condense, or steer) light received through the slanted translucent aperture 218 so that it can be received by the optical receiver. In some cases, the micro-optic element 228 or lens 232 may include a diffractive optical element.

In an alternative to the optical module placement shown in FIG. 6, an optical module could be mounted on a slanted surface and receive light from, or emit light into, the slanted translucent aperture 218 similarly to how the optical receiver or optical transmitter described with reference to FIG. 2A receives or emits light through a translucent aperture that is oriented perpendicular to a display stack.

In an alternative to the slanted translucent aperture 218 described with reference to FIG. 6, the micro-optic element 228 and/or lens 232 described with reference to FIG. 6 may be used to receive or emit light, at an angle, through a translucent aperture oriented perpendicular to the display stack 200.

Figure 7A:
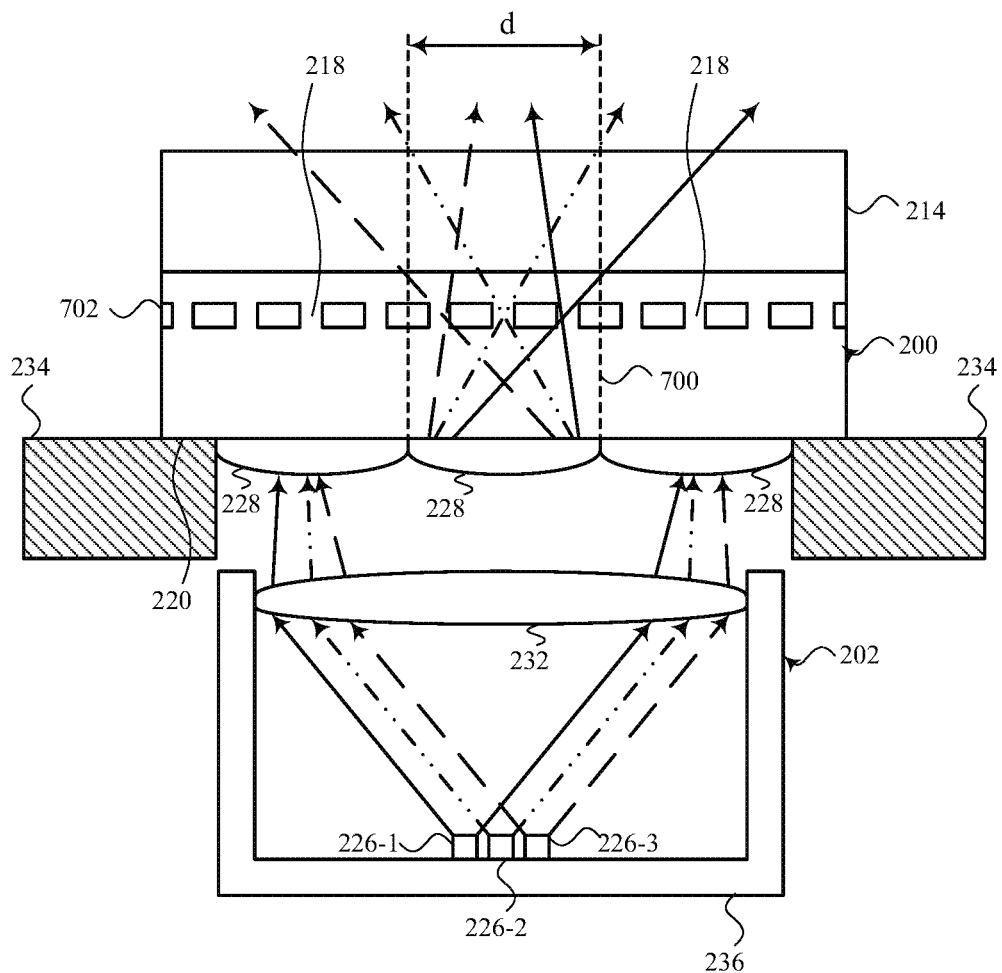
FIG. 7A shows another alternative elevation of the display stack shown in FIGS. 2A and 2B, with an optical module configured as described with reference to FIG. 4 but including multiple optical transmitters.

FIG. 7A shows another alternative elevation of the display stack 200 shown in FIGS. 2A and 2B, with an optical module 202 configured as described with reference to FIG. 4 but including multiple optical transmitters 226 (e.g., a first optical transmitter 226-1, a second optical transmitter 226-2, and a third optical transmitter 226-3). FIG. 7A shows the display stack 200 as a singular structure and does not call out the various display stack layers described with reference to other figures. However, the display stack 200 shown in FIG. 7A may include the layers described in other figures, and/or other or different layers.

Illustrated in FIG. 7A is a pixel 700 having at least one dimension of width "d". A micro-optic element 228 may be aligned with the width of the pixel 700, but need not be. In alternative embodiments, more than one micro-optic element 228 may be aligned with or overlap the pixel 700. The opaque elements within the display stack 200 may define multiple translucent apertures 218 extending from the front surface to the back surface 220 of the display stack 200, as generally illustrated by the openings in a layer 702. Each micro-optic element 228 may be positioned behind multiple translucent apertures 218. A plurality of pixels may be distributed in an array oriented parallel to the display surface of the display stack 200, and each pixel may be configured similarly to (or different from) the pixel 700.

Light emitted by each of the optical transmitters 226-1, 226-2, 226-3 may pass through a same or different set of one or more micro-optic elements 228, and the light passing through a single micro-optic element 228 may pass through a same or different set of multiple translucent apertures 218. If the optically clear portions of the translucent apertures 218 are generally rectangular or square, the beams of light passing through each translucent aperture 218 in the display stack 200 may have a generally rectangular or square cross-section in a far-field. The rectangular or square cross-sectioned beams may overlap or not overlap, depending on the configuration of various elements within the optical module 202 and display stack 200, and depending on the distance from the cover 214 to the far-field.

In some embodiments, all of the optical transmitters 226-1, 226-2, 226-3 may be operated to emit light at the same time. In other embodiments, the optical transmitters 226-1, 226-2, 226-3 may be operated to emit light singularly, or in different combinations with other optical transmitters 226-1, 226-2, 226-3. Configuring the optical transmitters 226-1, 226-2, 226-3 to be individually addressed and operated can enable beam shaping or beam scanning in a far-field.

In some embodiments, the optical transmitters 226-1, 226-2, 226-3 may emit light having the same wavelength (or color). In other embodiments, different optical transmitters 226-1, 226-2, 226-3 may emit light having different wavelengths (or colors). The light emitted by different optical transmitters may pass through the same or different translucent apertures 218 in the display stack 200.

Figure 8:
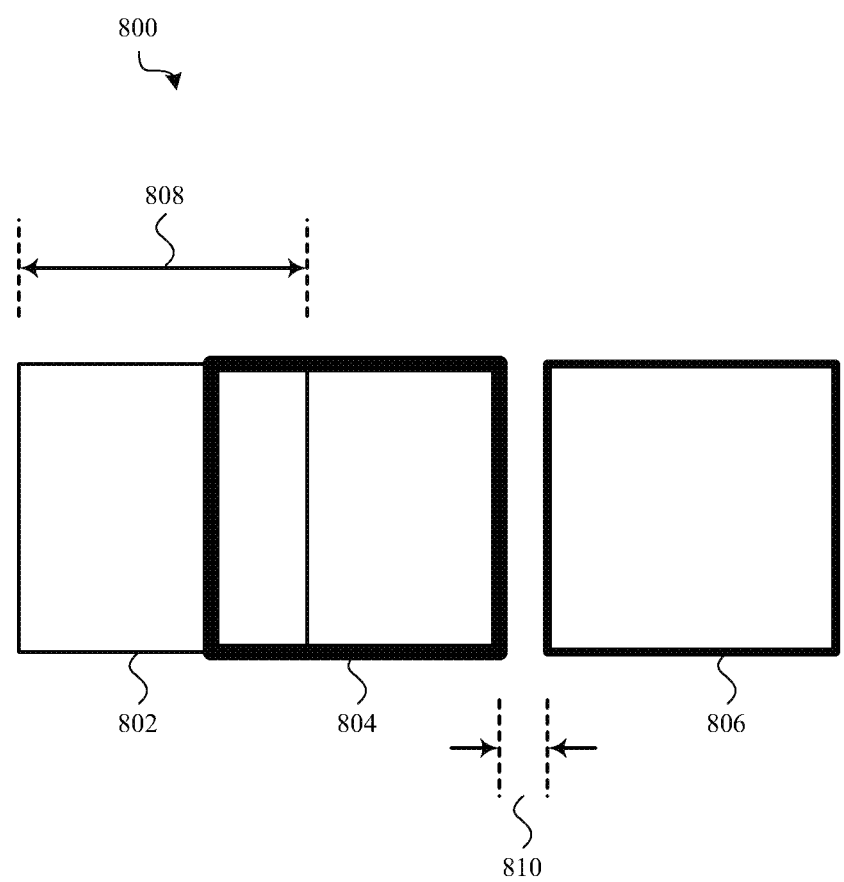
FIG. 8 shows an example pattern of illumination emitted by an array of optical transmitters, which optical transmitters may be positioned behind a display stack and transmit light through translucent apertures in the display stack.

In some embodiments, the collimating lens 232 may have a focal length of "F", and the micro-optic elements 228 may have focal lengths of "f". In these embodiments, and in some cases, the ratio between F and f may match the magnification ratio from the optical transmitter pitch to the translucent aperture pitch, such that the optical transmitters may be re-imaged through translucent apertures 218 for every pixel 700. In some cases, the best re-imaging beam quality and lowest optical transmission loss through the translucent apertures 218 may be achieved when the working distance between the collimating lens 232 and the micro-optic elements 228 is F+f. Lateral alignment between the collimating lens 232 and micro-optic elements 228 is not necessary. An example far-field image generated using the display stack 200, micro-optic elements 228, and optical module 202 described with reference to FIG. 7A is shown in FIG. 8.

In some embodiments, the F/f ratio, display pixel diameter (d), translucent aperture size, micro-optic element pitch (D), and/or emitter aperture/pitch/segmentation/array size may be configured to allow one or multiple general or specific emitters, segments, arrays to be focused through one or multiple general or specific translucent apertures 218.

The display stack 200, micro-optic elements 228, and optical module 202 described with reference to FIG. 7A may be used to emit light through the multiple translucent apertures 218 per pixel described with reference to FIG. 3.

Figure 7B:
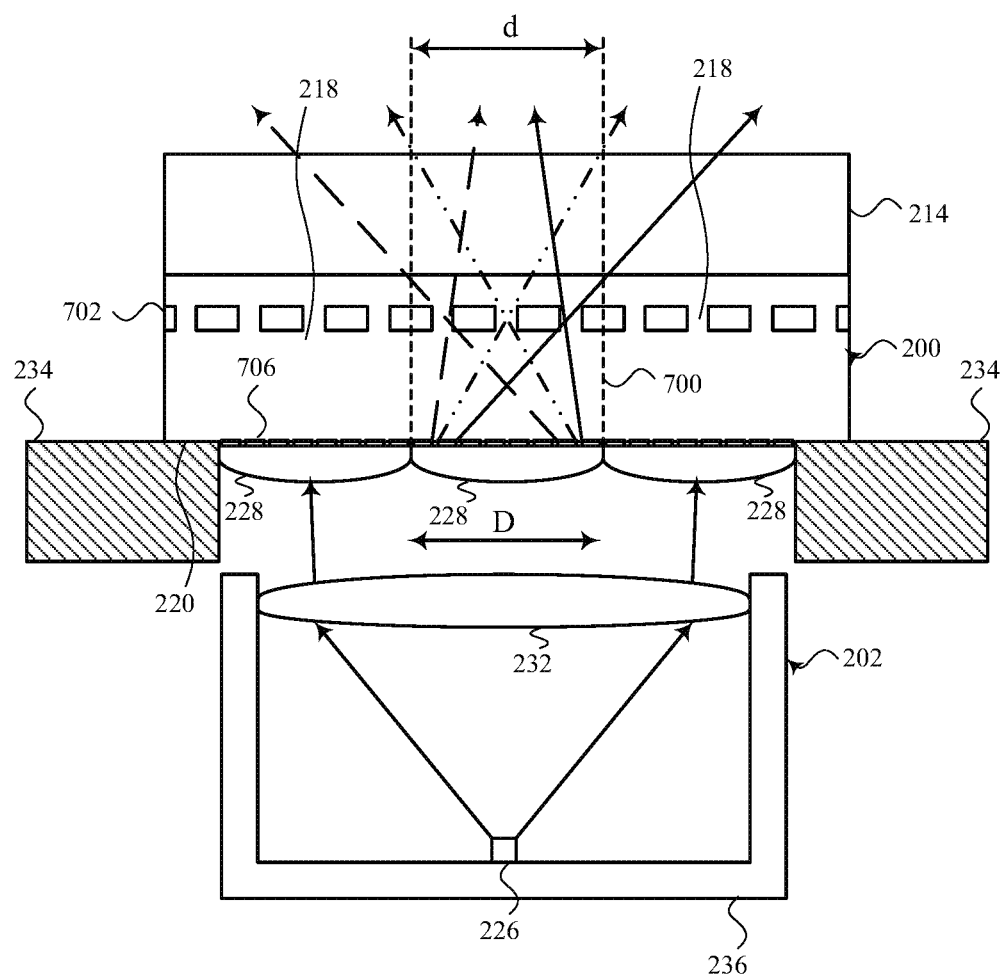
FIG. 7B shows an alternative to what is shown in FIG. 7A, with the optical module including only a single optical transmitter, and the micro-optic elements defining a meta-surface that shapes light emitted by the optical transmitter as it exits the micro-optic element.

FIG. 7B shows an alternative to what is shown in FIG. 7A, with the optical module 202 including only a single optical transmitter 226, and the micro-optic elements 228 defining a meta-surface 706 that shapes light emitted by the optical transmitter 226 as it exits the micro-optic elements 228. For example, a micro-optic element 228 may have a meta-surface 706 (e.g., a diffraction grating) positioned between the micro-optic element 228 and the display stack 200, which meta-surface 706 splits light focused by the micro-optic element 228. Alternatively, a micro-optic element 228 could have a different configuration, or have a meta-surface formed on a different surface of the micro-optic element 228.

FIG. 8 shows a pattern of illumination 800 emitted by one or more optical transmitters, which optical transmitters may be positioned behind a display stack and transmit light through translucent apertures in the display stack, as described with reference to FIGS. 2A-2B, 3, 4, 5, 6, and 7A-7B. As shown, the light projected through each translucent aperture may have a generally rectangular or square aspect ratio in a far-field of view. For example, light emitted through a first translucent aperture may have the shape 802, light emitted through a second translucent aperture may have the shape 804, and light emitted through a third translucent aperture may have the shape 806. The shapes 802 and 804 overlap each other, but neither of the shapes 802 or 804 overlap the shape 806. The dimensions of various aspects of the pattern on a surface or object, including the dimensions or skew of individual light beams (e.g., dimension 808), or the dimensions or skew between different light beams (e.g., a distance between beams or an amount of overlap of beams, such as the dimension 810), may be used to determine a proximity or distance of the object to the optical transmitter.

Figure 9A:
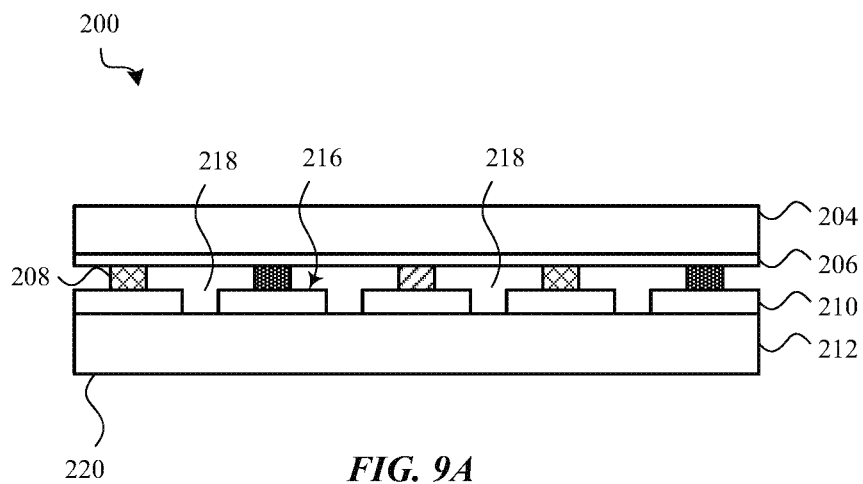
FIGS. 9A-9F illustrate an example method of forming a micro-lens array on the back surface of a display stack.

FIGS. 9A-9F illustrate an example method of forming a micro-lens array on the back surface of a display stack. Turning to FIG. 9A, the method begins with a display stack 200 including a set of opaque elements (e.g., a mesh of conductive traces, which traces are coupled to the TFTs of a set of light-emitting elements 216). The mesh of conductive traces may include anode traces connected to a back side of the light-emitting elements 216. An additional set of elements, including a cathode contact for the set of light-emitting elements 216, a mesh of conductive traces forming a touch sensor, a polarizer, and so on, may be formed on a front side (i.e., a light-emitting side) of the light-emitting elements. In some embodiments, the light-emitting elements may include OLEDs. By way of example, the display stack 200 is shown to include the same layers included in the display stack described with reference to FIG. 2A.

As described with reference to FIGS. 2A, 2B, 3, 4, 5, 6, and 7A-7B, a set of translucent apertures 218 may be defined by the opaque elements of the display stack 200, and may extend from a front surface to a back surface 220 of the display stack 200.

Figure 9B:
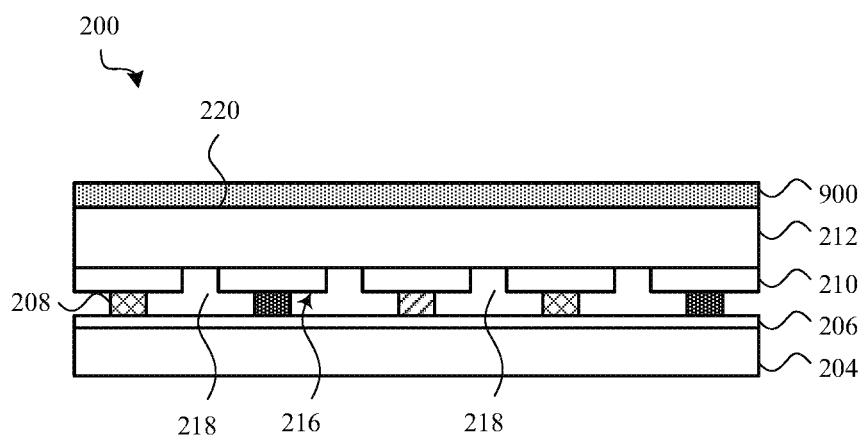

FIG. 9B shows an inversion of the display stack 200 described with reference to FIG. 9A, and shows the application of a photoresist 900 to the back surface 220 of the display stack 200. The photoresist 900 may include a translucent (or transparent) material, which material is used to grow a micro-lens array on the display stack 200.

Figure 9C:
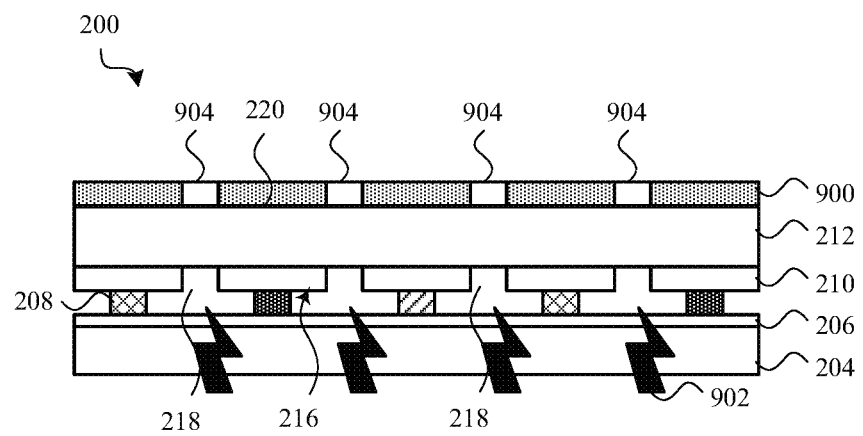

FIG. 9C shows the front surface of the display stack 200 being exposed to electromagnetic radiation 902 (e.g., ultraviolet (UV) radiation). The opaque elements of the display stack 200, and particularly the mesh of conductive traces connected to the back side of the light-emitting elements, serves as a photomask, such that the electromagnetic radiation 902 passes through the translucent apertures 218 and cures the portions 904 of the photoresist 900 that are aligned with the translucent apertures 218. Use of the opaque elements within the display stack 200 as a photomask provides for self-alignment of micro-lenses with the translucent apertures 218, as explained further with reference to FIGS. 9D-9F.

Figure 9D:
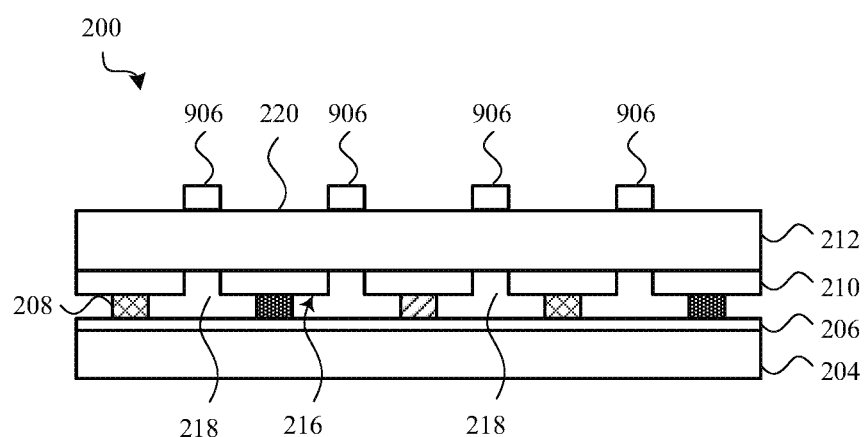
Figure 9E:
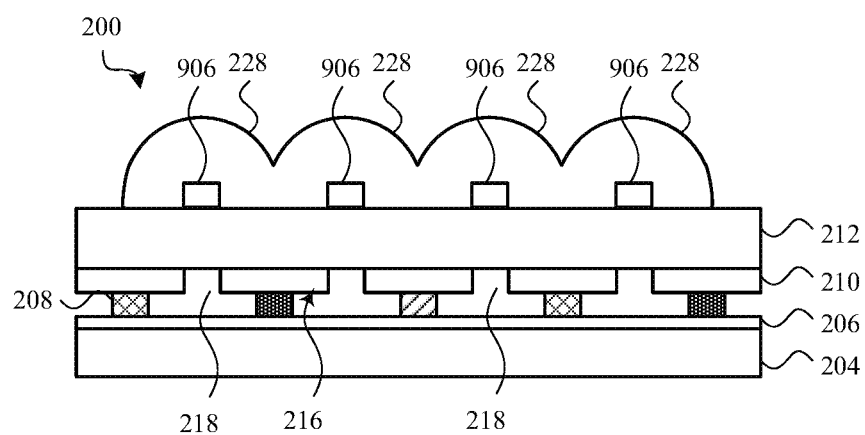

As shown in FIG. 9D, the uncured portions of the photoresist 900 may be removed (e.g., by etching), leaving a plurality of seeds 906 for growing a micro-lens array. FIG. 9E shows the micro-lens array (including micro-lenses or micro-optic elements 228) after it has been grown, with each micro-lens in the array being centered about one of the seeds 906. In some cases, the micro-lens array may be grown using a reflow process (e.g., by reflowing the seeds 906 or material that is added to the seeds 906).

Figure 9F:
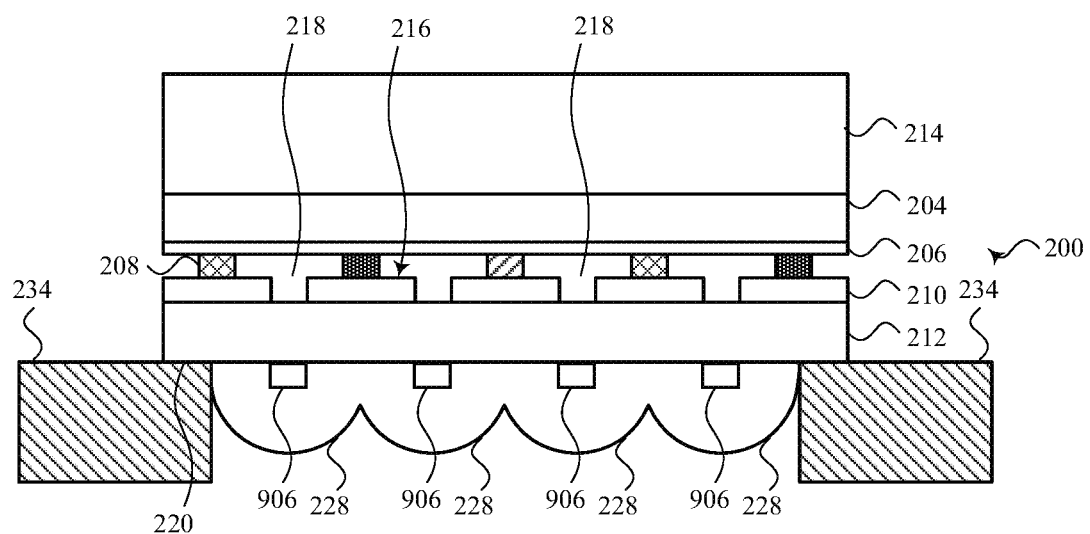

FIG. 9F shows the display stack 200 after it has been inverted again and attached to the underside (interior side) of a cover 214. In some embodiments, the cover 214 may be a glass or plastic cover. In some embodiments, the display stack 200 may be attached to the cover 214 using a transparent adhesive. Following attachment of the display stack 200 to the cover 214, one or more optical modules may be positioned behind and spaced apart from the display stack 200, as described with reference to FIG. 2A, 2B, 3, 4, 5, 6, or 7A-7B.

In other embodiments, the micro-optic elements 228 may be constructed or formed apart from the display stack 200, and then actively or passively aligned with the translucent apertures 218 in the display stack 200.

Figure 10:
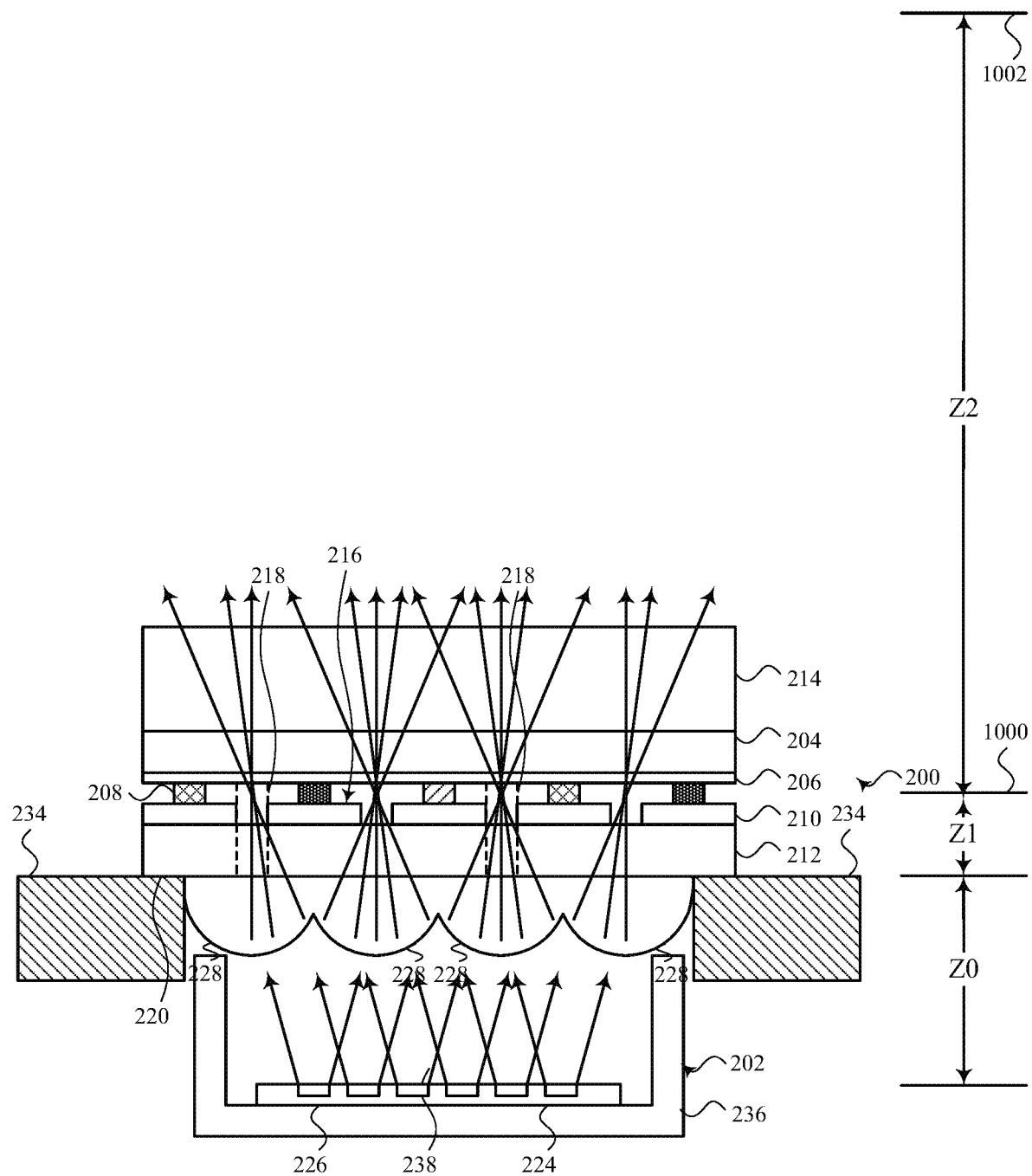
FIG. 10 shows another example embodiment of a display stack and optical module, in relation to near-field and far-field conjugated focal planes.

FIG. 10 shows another example embodiment of a display stack 200 and optical module 202. The display stack 200 and optical module 202 are shown in relation to near-field and far-field conjugated focal planes 1000, 1002 of the optical module 202.

By way of example, the display stack 200 is configured as shown in FIGS. 2A and 2B. The display stack 200 may also be configured in other ways, and may include the layers described in other figures and/or other or different layers.

The optical module 202 is shown to include multiple optical transmitters 226 (e.g., a first optical transmitter 226-1, a second optical transmitter 226-2, and a third optical transmitter 226-3), but may alternatively include a single optical transmitter (e.g., as described with reference to FIG. 4).

One or more micro-optic elements 228 may be formed on the back surface of the display stack 200. By way of example, an array of micro-optic elements 228 is shown. In some embodiments, the micro-optic elements 228 may be or include micro-lenses or GRIN lenses. The micro-optic elements 228 may be spherical or have other shapes (e.g., squares, rounded corner squares, and so on).

The opaque elements within the display stack 200 may define multiple translucent apertures 218 extending from the front surface to the back surface 220 of the display stack

200. Each micro-optic element 228 may be positioned behind, or aligned with, one translucent aperture 218 or multiple translucent apertures 218. The passage of light through one or more micro-optic elements 228, and multiple translucent apertures 218, may cause the light to diffract (i.e., the apertures 218 may operate as a diffraction grating). Light from the same coherent emitters, that diffracts as it passes through the micro-optic element(s) 228 and translucent apertures 218, may constructively and de-constructively combine to produce a structured light pattern in one or more conjugated focal planes of the optical module 202. Geometric re-imaging and/or diffraction of the light that passes through the apertures 218 may at the same time provide diffuse illumination (e.g., uniform or substantially uniform illumination) in one or more other conjugated focal planes of the optical module 202. For example, diffuse or uniform illumination may be provided in at least a first conjugated focal plane 1000 intersecting the translucent apertures 218, and a structured light pattern may be provided in at least a second conjugated focal plane 1002 external to the cover 214. In this manner, the display stack 200 and optical module 202 may function as a multi conjugated focal plane projection system.

In some embodiments, the first conjugated focal plane 1000 may be at a distance Z1 from the micro-optic elements, and may intersect the translucent apertures 218. In alternative embodiments, the first conjugated focal plane may be located somewhat interior or exterior from the translucent apertures 218 (e.g., closer or farther from the optical transmitters 226). The second conjugated focal plane 1002 may be at a distance Z2 from the first conjugated focal plane, and by way of example is shown to be exterior to the cover 214 (and external to the device that includes the cover 214). The apertures of the optical transmitters 226 may be at a distance from the micro-optic elements 228. In other embodiments, the various arrays and conjugated focal planes may be positioned at other distances from each other and/or at other distances from components of the display stack 200. In some other cases, the pitch (D) of the micro-optic elements 228, the module working distance (Z0), and/or emitter aperture/ pitch/segmentation/array size may be configured to allow one or multiple general or specific emitters, segments, or arrays to be focused through one or multiple general or specific translucent apertures 218, and to optimize the structured light pattern arrangement and/or contrast at a far-field interface.

Light emitted by each of the optical transmitters 226-1, 226-2, 226-3 may pass through a same or different set of one or more micro-optic elements 228, and the light passing through a single micro-optic element 228 may pass through a same or different set of multiple translucent apertures 218.

In some embodiments, all of the optical transmitters 226-1, 226-2, 226-3 may be operated to emit light at the same time. In other embodiments, the optical transmitters 226-1, 226-2, 226-3 may be operated to emit light singularly, or in different combinations with other optical transmitters 226-1, 226-2, 226-3. Configuring the optical transmitters 226-1, 226-2, 226-3 to be individually addressed and operated, or to be addressed in two or more overlapping (interspersed) or non-overlapping (non-interspersed) subsets, can enable the optical module 202 to provide different types of structured light patterns in a near and/or far-field (e.g., in the second conjugated focal plane 1002).

In some embodiments, the optical transmitters 226-1, 226-2, 226-3 may emit light having the same wavelength (or color). In other embodiments, different optical transmitters 226-1, 226-2, 226-3 may emit light having different wavelengths (or colors). The light emitted by different optical transmitters may pass through the same or different translucent apertures 218 in the display stack 200.

Figure 11A:
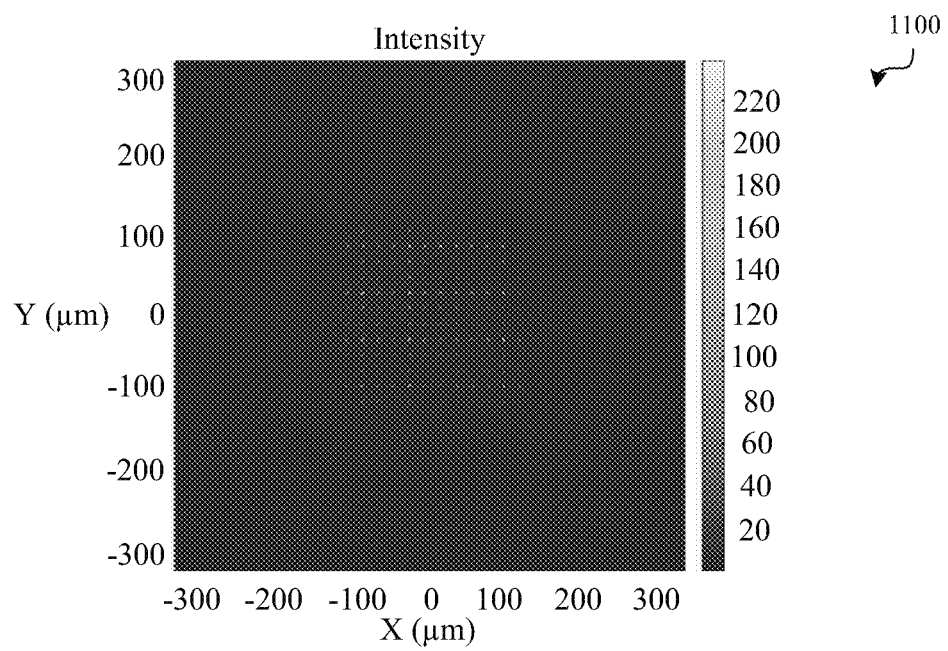
FIG. 11A shows example illumination of a near-field conjugated focal plane by an under-display optical module.
Figure 11B:
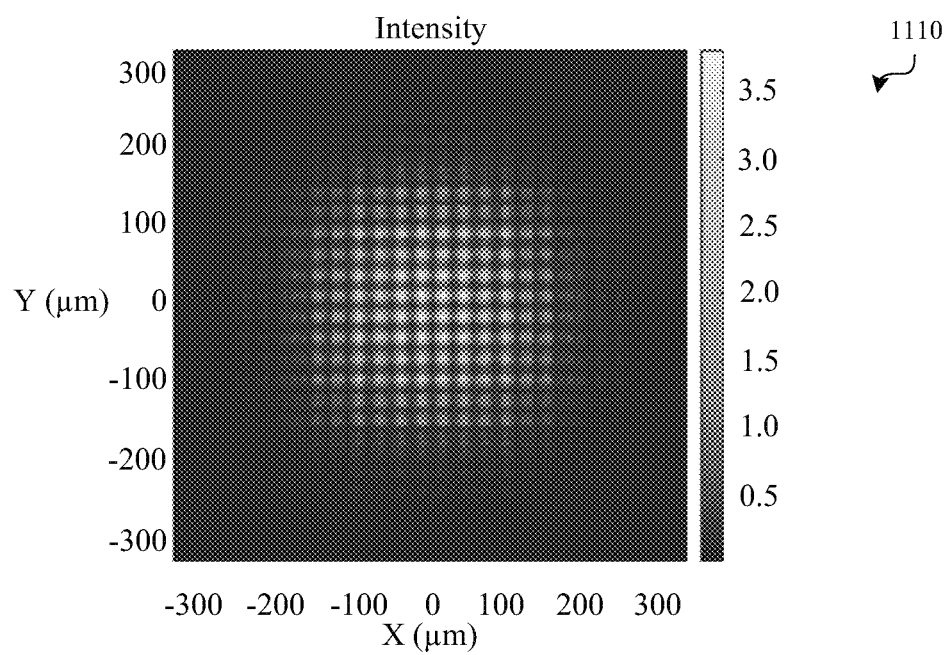
FIG. 11B shows example illumination of a far-field conjugated focal plane by an under-display optical module.

FIGS. 11A and 11B show examples of near-field and far-field illumination, which illumination may be provided by an under-display optical module similar to the one described with reference to FIG. 10. More specifically, FIG. 11A shows example illumination 1100 (intensity of illumination) of a near-field conjugated focal plane, and FIG. 11B shows example illumination 1110 (intensity of illumination) of a far-field conjugated focal plane. As can be seen in FIG. 11A, the near-field conjugated focal plane is illuminated diffusely (e.g., in a substantially uniform manner), while the far-field conjugated focal plane is illuminated with a structured light pattern.

In some examples, a device may include one or more under-display light receivers (e.g., photodetectors) that sense the amount of emitted light that reflects from an object that enters or moves within the near-field conjugated focal plane, and determines a presence, proximity, location, or size of the object (or objects) from the sensed amount(s) of reflected light. Additionally or alternatively, the device may include a camera that senses the amount(s) of reflected light, a color or pattern of the reflected light, and so on, and uses parameters of the sensed light to determine a presence, proximity, location, size, or other parameters of an object (or objects) that enters or moves within the near-field conjugated focal plane. In some examples, the same device may use a camera (e.g., an under-display camera) to acquire an image, or set of images, of an object that is illuminated by an optical transmitter of the under-display optical module, and the processor may be configured to determine parameters of the object using the image(s) of the object and parameters of the structured light pattern in at least the far-field conjugated focal plane. For example, the processor may generate a three-dimensional map of the object using the image(s) of the object and the parameters of the structured light pattern in at least the far-field conjugated focal plane.

FIG. 12 shows an example plan view 1200 of a set of emitters 1202 that may be included in an under-display optical module. The set of emitters 1202 is shown in relation to an array of micro-optic elements 1204.

The design considerations described with reference to FIG. 12 may be applied to a device that includes a larger or smaller set of emitters and/or a larger or smaller array of micro-optic elements. The relative size of the emitters 1202 in relation to the micro-optic elements 1204 is also just an example, and may be varied in other embodiments. Also, different emitters 1202 may have the same or different shapes or sizes, and different micro-optic elements 1204 may have the same or different shapes or sizes.

In some embodiments, a processor may use the emitters 1202 shown in FIG. 12 to provide different structured light patterns in a conjugated focal plane at different times (e.g., to provide multi-frame projection in which the structured light pattern can differ from one frame to another). For example, a processor may be configured to activate a first subset 1206 of the emitters 1202 during a first time period (during a first frame), and activate a second subset 1208 of the emitters 1202 during a second time period (e.g., during a second frame). Activation of the first subset 1206 of emitters 1202 may produce a first structured light pattern (e.g., the structured light pattern 1300 shown in FIG. 13A), and activation of the second subset 1208 of emitters 1202 may produce a second structured light pattern (e.g., the structured light pattern 1310 shown in FIG. 13B).

By way of example, the second subset 1208 of emitters 1202 is shown to include the same number and pattern of emitters as the first subset 1206 of emitters 1202, but is rotated and spatially offset from the first subset 1206 of emitters 1202. In some embodiments, the emitters 1202 of both the first and second subsets 1206, 1208 may be configured and positioned to provide diffuse or uniform illumination in a first conjugated focal plane (e.g., a near-field conjugated focal plane), but provide different structured light patterns in one or more other conjugated focal planes (e.g., in the same or different far-field conjugated focal planes).

In some embodiments, the first and second subsets 1206, 1208 of emitters 1202, and/or their different structured light patterns in a far-field conjugated focal plane, may be spatially multiplexed (e.g., spatially offset from one another). In other embodiments, the first and second subsets 1206, 1208 of emitters 1202, and/or their different structured light patterns in a far-field conjugated focal plane, may be interspersed or overlapping.

FIG. 12 shows how different structured light patterns can be achieved by varying the placement of an array of emitters 1202 with respect to an array of micro-optic elements 1204. Additionally or alternatively, different structured light patterns can be achieved by varying the apertures or pitch of emitters 1202 (e.g., varying VCSEL apertures or pitch); varying emitter-to-micro-optic element working distance (e.g., varying VCSEL to MLA working distance); varying micro-optic element parameters (e.g., varying MLA curvature); and so on. In some embodiments, different subsets of emitters 1202 may be individually addressable. In some embodiments, each emitter 1202 may be individually addressable. Individual addressability of emitters 1202 can enable the generation of a large number of structured light patterns, through various constructive/de-constructive interference effects. Individual addressability (or an ability to address more granular subsets of emitters 1202) can assist in reducing the footprint (or die area) of an under-display optical transmitter capable of producing multiple structured light patterns.

In some embodiments, far-field structured light pattern differences (or irregularities, or different structured light pattern uniqueness) and distance-dependent (or distance-independent) structured light patterns may be achieved while maintaining optimal through-display efficiency in a near-field conjugated focal plane.

Different structured light patterns may be generated sequentially (e.g., in different frames), simultaneously, or on demand. In some cases, a camera may acquire images that indicate how an object is illuminated by the different structured light patterns, and more accurately determine parameters of the object (e.g., generate a more precise or finer resolution three-dimensional map of the object) using the images. Alternatively, environmental conditions or object parameters may be sensed or provided, and the processor may activate one or multiple subsets of emitters 1202 such that the object is properly illuminated for the sensed or provided environmental conditions or object parameters. In some embodiments, multi-frame projection, and/or addressable emitters or subsets of emitters, can enable power and time-efficient three-dimensional sensing or other three-dimensional sensing/display projection taks.

Each of FIGS. 13A and 13B depict illumination (e.g., normalized irradiance) along x and y axes of a conjugated focal plane parallel to the a plane passing through the set of emitters 1202 or array of micro-optic elements 1204 described with reference to FIG. 12, or parallel to the exterior surface of the cover described with reference to FIG. 10 and other figures. Each of FIGS. 13A and 13B represent normalized irradiance on a scale of 0 to 1, in Watts per square meter ($W/m^2$).

In some embodiments of the display stacks and optical modules described herein, micro-optic elements disposed under a display stack may not be attached or formed on a back surface of the display stack, but may instead be abutted to a display stack or otherwise positioned between an under-display optical module and a display stack. In some of these embodiments, the micro-optic elements may be provided as part of the optical module. In some embodiments, the micro-optic elements may be formed (or grown) on individual ones or groups of optical emitters (e.g., VCSELs) or optical detectors (e.g., photodiodes). In some cases, micro-optic elements may be precisely aligned with optical emitters or optical detectors (or vice versa). In other cases, micro-optic elements may be loosely aligned with optical emitters or optical detectors, and a device may be calibrated based on the actual alignment of parts in a particular device or set of devices.

FIG. 14 illustrates a method 1400 of sensing a proximity of an object to a device having a light-emitting display. The method 1400 may be performed using any of the display stacks and optical modules described herein, in combination with a processor such as the processor described with reference to FIG. 16.

At block 1402, the method 1400 may optionally include emitting light from an optical transmitter. The emitted light may be collimated at block 1404, and the collimated emitted light may be focused toward a first translucent aperture in a display surface of a light-emitting display at block 1406.

At block 1408, the method 1400 may include receiving light through a second translucent aperture in the display surface. The received light may be collimated at block 1410, and the collimated received light may be condensed toward an optical receiver at block 1412. An output of the optical receiver may be quantified (e.g., by a processor of the device) at block 1414, and the quantified output of the optical receiver may be correlated to the proximity of the object to the device at block 1416.

The light focused toward the first translucent aperture, at block 1406, may have a predetermined set of one or more wavelengths. The predetermined set of wavelengths (or single wavelength) may be established by the configuration of the optical transmitter, or by filtering performed by a collimating lens or focusing lens. Similarly, the light received by the optical receiver may have the predetermined set of one or more wavelengths (or single wavelength). The predetermined set of wavelengths (or single wavelength) received by the optical receiver may be established by filtering performed by a collimating lens or condensing lens, or by the configuration of the optical receiver.

In embodiments in which the operations at blocks 1402-1406 are performed, and the light emitted from the optical transmitter includes an optical pulse, the method 1400 may further include recording an emission time of the optical pulse; determining a reception time of a reflection of the optical pulse using the optical receiver; and determining a distance between the object and the device using the emission time and the reception time (e.g., based on a ToF of the optical pulse and the speed of light).

In some embodiments of the method 1400, quantifying the output of the optical receiver may include quantifying a change in the output of the optical receiver.

In some cases, the method 1400 may be modified to emit and/or receive light through a plurality of translucent apertures in the display surface. The method 1400 may also be modified to make other determinations, to acquire an image (including an image of a fingerprint or face), to make measurements (e.g., ambient light measurements), or to transmit and receive wireless communications.

FIG. 15 illustrates an example method of illuminating a field of view. The method 1400 may be performed using any of the display stacks and optical modules described herein (so long as the optical module includes an optical transmitter), in combination with a processor such as the processor described with reference to FIG. 16.

At block 1502, the method 1500 may include emitting light from an array of optical transmitters. The light may be emitted through an array of micro-optic elements attached to (or otherwise positioned behind) the back of a display stack (e.g., a display stack of a light-emitting display), and the array of micro-optic elements may direct at least a portion of the emitted light through an array of translucent apertures in the display stack.

At block 1504, an amount of the emitted light that is reflected from a first object (e.g., a finger or stylus positioned on or proximate a cover disposed over the display stack) may be sensed. In some embodiments, the reflected light may be sensed by an optical receiver positioned under or behind the display stack. The optical receiver may include an array of photodiodes.

At block 1506, and before, after, or in parallel with the operations at block 1504, at least one image of a second object (e.g., a user's face or head, or a component of a user's face, or a user's hand) may be acquired. In some embodiments, the image(s) may be acquired by an image sensor (e.g., a camera) disposed under or behind the display stack. In some embodiments, the micro-optic elements positioned between the optical transmitter and display stack may not be positioned between the display stack and the image sensor, so that the image sensor may adequately identify irregularities in a structured light pattern that illuminates the second object. The second object may be illuminated by a structured light pattern, or by multiple structured light patterns, as the image(s) are acquired. The structured light pattern(s) may be formed by constructive and deconstructive interference of the light emitted at block 1502.

At block 1508, the method 1500 may include determining a proximity and/or location of the first object, using the sensed amount of reflected light.

At block 1510, the method 1500 may include generating a three-dimensional map of the second object using the acquired image(s).

In some cases, the determination made at block 1508 and three-dimensional map generated at block 1510 may be performed for the same object and/or used as part of a biometric authentication function.

FIG. 16 shows a sample electrical block diagram of an electronic device 1600, which electronic device may in some cases take the form of the device described with reference to FIGS. 1A and 1B and/or have a display stack and under-display optical sensor as described with reference to FIGS. 1A-15. The electronic device 1600 may include a display 1602 (e.g., a light-emitting display), a processor 1604, a power source 1606, a memory 1608 or storage device, a sensor system 1610, or an input/output (I/O) mechanism 1612 (e.g., an input/output device, input/output port, or haptic input/output interface). The processor 1604 may control some or all of the operations of the electronic device 1600. The processor 1604 may communicate, either directly or indirectly, with some or all of the other components of the electronic device 1600. For example, a system bus or other communication mechanism 1614 can provide communication between the display 1602, the processor 1604, the power source 1606, the memory 1608, the sensor system 1610, and the I/O mechanism 1612.

The processor 1604 may be implemented as any electronic device capable of processing, receiving, or transmitting data or instructions, whether such data or instructions is in the form of software or firmware or otherwise encoded. For example, the processor 1604 may include a microprocessor, a central processing unit (CPU), an application-specific integrated circuit (ASIC), a digital signal processor (DSP), a controller, or a combination of such devices. As described herein, the term "processor" is meant to encompass a single processor or processing unit, multiple processors, multiple processing units, or other suitably configured computing element or elements.

It should be noted that the components of the electronic device 1600 can be controlled by multiple processors. For example, select components of the electronic device 1600 (e.g., the sensor system 1610) may be controlled by a first processor and other components of the electronic device 1600 (e.g., the display 1602) may be controlled by a second processor, where the first and second processors may or may not be in communication with each other.

The power source 1606 can be implemented with any device capable of providing energy to the electronic device 1600. For example, the power source 1606 may include one or more batteries or rechargeable batteries. Additionally or alternatively, the power source 1606 may include a power connector or power cord that connects the electronic device 1600 to another power source, such as a wall outlet.

The memory 1608 may store electronic data that can be used by the electronic device 1600. For example, the memory 1608 may store electrical data or content such as, for example, audio and video files, documents and applications, device settings and user preferences, timing signals, control signals, and data structures or databases. The memory 1608 may include any type of memory. By way of example only, the memory 1608 may include random access memory, read-only memory, Flash memory, removable memory, other types of storage elements, or combinations of such memory types.

The electronic device 1600 may also include one or more sensor systems 1610 positioned almost anywhere on the electronic device 1600. However, at least one optical sensor, or an optical receiver or optical transmitter, may be positioned under the display 1602 and may transmit and/or receive light through the display 1602. The sensor system(s) 1610 may be configured to sense one or more type of parameters, such as but not limited to, light; touch; force; heat; movement; relative motion; biometric data (e.g., biological parameters) of a user; and so on. By way of example, the sensor system(s) 1610 may include a heat sensor, a position sensor, a light or optical sensor, an accelerometer, a pressure transducer, a gyroscope, a magnetometer, a health monitoring sensor, and so on. Additionally, the one or more sensor systems 1610 may utilize any suitable sensing technology, including, but not limited to, capacitive, ultrasonic, resistive, optical, ultrasound, piezoelectric, and thermal sensing technology.

The I/O mechanism 1612 may transmit or receive data from a user or another electronic device. The I/O mechanism 1612 may include the display 1602, a touch sensing input surface, a crown, one or more buttons (e.g., a graphical user interface "home" button), one or more cameras (including an under-display camera), one or more microphones or speakers, one or more ports such as a microphone port, and/or a keyboard. Additionally or alternatively, the I/O mechanism 1612 may transmit electronic signals via a communications interface, such as a wireless, wired, and/or optical communications interface. Examples of wireless and wired communications interfaces include, but are not limited to, cellular and Wi-Fi communications interfaces.

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art, after reading this description, that many modifications and variations are possible in view of the above teachings.

What is claimed is:

1. A device, comprising:
a display stack including a set of opaque elements defining a translucent aperture extending through the display stack;
an optical receiver spaced apart from and behind a back surface of the display stack; and
at least one micro-lens formed on the back surface of the display stack, between the display stack and the optical receiver, the at least one micro-lens including a micro-lens having a focal point located within the translucent aperture; wherein:
the optical receiver is configured to receive light through the translucent aperture and the at least one micro-lens.

2. The device of claim 1, wherein the display stack comprises an organic light-emitting diode (OLED) array.

3. The device of claim 1, wherein the display stack includes different sets of opaque elements defining different translucent apertures extending through the display stack.

4. The device of claim 3, wherein:
the at least one micro-lens formed on the back surface of the display stack comprises a micro-lens array formed on the back surface of the display stack; wherein:
the micro-lens having the focal point located within the translucent aperture comprises a first micro-lens of the micro-lens array.

5. The device of claim 3, wherein:
the translucent aperture is a first translucent aperture;
the micro-lens is a first micro-lens;
the different translucent apertures comprise a second translucent aperture;
the at least one micro-lens comprises the first micro-lens and a second micro-lens;
the second micro-lens has a focal point located within the second translucent aperture; and
the optical receiver is configured to receive light through the first translucent aperture and the first micro-lens, and through the second translucent aperture and the second micro-lens.

6. A device, comprising:
a multi-layer display stack including a set of opaque elements;
an optical module spaced apart from and behind a back surface of the display stack; and
at least one micro-optic element formed on the back surface of the display stack, between the display stack and the optical module; wherein,
different subsets of the opaque elements define different translucent apertures extending from a front surface to the back surface of the display stack;
a first translucent aperture of the different translucent apertures has a first aperture size;
a second translucent aperture of the different translucent apertures has a second aperture size;
a first micro-optic element of the at least one micro-optic element is aligned with the first translucent aperture and has a first size; and
a second micro-optic element of the at least one micro-optic element is aligned with the second translucent aperture and has a second size.

7. The device of claim 6, wherein the at least one micro-optic element includes a micro-optic element having a focal point located within one of the translucent apertures.

8. The device of claim 6, wherein the optical module comprises an optical receiver positioned to receive light through the display stack and at least the first micro-optic element.

9. The device of claim 8, wherein the optical module comprises a condensing lens positioned between the first micro-optic element and the optical receiver.

10. The device of claim 8, wherein the optical module further comprises an optical transmitter positioned to transmit light through at least the second micro-optic element and the display stack.

11. The device of claim 10, wherein the optical module comprises:
a condensing lens positioned between the first micro-optic element and the optical receiver; and
a collimating lens positioned between the optical transmitter and the second micro-optic element.

12. The device of claim 6, wherein the optical module comprises an optical transmitter positioned to transmit light through at least the first micro-optic element and the display stack.

13. The device of claim 12, further comprising:
a diffraction grating that shapes the light transmitted by the optical transmitter as the light exits the first micro-optic element.

14. The device of claim 6, wherein:
the optical module comprises at least two optical transmitters positioned to transmit light through at least the first micro-optic element and the display stack; and
light transmitted through the first micro-optic element is shaped by at least two translucent apertures of the different translucent apertures.

15. The device of claim 6, wherein the at least one micro-optic element comprises a micro-lens array.

16. The device of claim 6, wherein the at least one micro-optic element comprises at least one gradient-index (GRIN) lens.

17. The device of claim 6, wherein at least one translucent aperture of the different translucent apertures is transparent.

18. The device of claim 6, wherein:
the optical module comprises an optical transmitter positioned to transmit light through multiple translucent apertures of the different translucent apertures;
the transmitted light is transmitted through the at least one micro-optic element and the display stack; and
the transmitted light provides diffuse illumination in at least a first conjugated focal plane, and a structured light pattern in at least a second conjugated focal plane.

19. The device of claim 18, further comprising:
a cover disposed over the multi-layer display stack; wherein, the first conjugated focal plane is at an exterior surface of the cover or within a first distance from the exterior surface of the cover; and the second conjugated focal plane is at a second distance from the exterior surface of the cover, the second distance greater than the first distance.

20. The device of claim 18, further comprising:
a camera configured to acquire an image of an object illuminated by the optical transmitter; and
a processor configured to generate a three-dimensional map of the object using,
the image of the object; and
parameters of the structured light pattern in at least the second conjugated focal plane.

21. The device of claim 6, further comprising:
a processor; wherein,
the optical module comprises an optical transmitter positioned to transmit light through multiple translucent apertures of the different translucent apertures;
the transmitted light is transmitted through the at least one micro-optic element and the display;
the processor is configured to activate a first subset of emitters of the optical transmitter during a first time period, and activate a second subset of emitters of the optical transmitter during a second time period;
activation of the first subset of emitters produces a first structured light pattern in a conjugated focal plane; and
activation of the second subset of emitters produces a second structured light pattern in the conjugated focal plane.

22. A method of sensing a proximity of an object to a device having a light-emitting display, comprising:

emitting light from an optical transmitter;
collimating the emitted light;
focusing the collimated emitted light toward a first translucent aperture in a display surface of the light-emitting display;
receiving light through a second translucent aperture in the display surface;
collimating the received light;
condensing the collimated received light toward an optical receiver;
quantifying an output of the optical receiver; and
correlating the quantified output of the optical receiver to the proximity of the object to the device.

23. The method of claim 22, wherein the light focused toward the first translucent aperture has a predetermined set of one or more wavelengths, and the light received through the second translucent aperture by the optical receiver has the predetermined set of one or more wavelengths.

24. The method of claim 23, wherein the light emitted from the optical transmitter comprises an optical pulse, the method further comprising:
recording an emission time of the optical pulse;
determining a reception time of a reflection of the optical pulse using the optical receiver; and
determining a distance between the object and the device using the emission time and the reception time.

25. The method of claim 22, wherein quantifying the output of the optical receiver comprises:
quantifying a change in the output of the optical receiver.

* * * * *